(12) United States Patent
Mathewson et al.

(10) Patent No.: US 10,949,292 B1
(45) Date of Patent: Mar. 16, 2021

(54) MEMORY INTERFACE HAVING DATA SIGNAL PATH AND TAG SIGNAL PATH

(71) Applicant: Arm Limited, Cambridge (GB)

(72) Inventors: Bruce James Mathewson, Papworth Everard (GB); Phanindra Kumar Mannava, Austin, TX (US); Michael Andrew Campbell, Waterbeach (GB); Alexander Alfred Hornung, Cambridge (GB); Alex James Waugh, Cambridge (GB); Klas Magnus Bruce, Leander, TX (US); Richard Roy Grisenthwaite, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/594,223

(22) Filed: Oct. 7, 2019

(51) Int. Cl.
*G06F 11/20* (2006.01)
*G11C 29/08* (2006.01)
*G06F 11/10* (2006.01)
*G11C 29/18* (2006.01)
*G06F 11/30* (2006.01)

(52) U.S. Cl.
CPC ...... *G06F 11/1016* (2013.01); *G06F 11/1056* (2013.01); *G06F 11/3037* (2013.01); *G11C 29/18* (2013.01)

(58) Field of Classification Search
None
See application file for complete search history.

(56) References Cited

U.S. PATENT DOCUMENTS

| | | | | |
|---|---|---|---|---|
| 5,629,950 A | * | 5/1997 | Godiwala | G06F 11/1064 711/131 |
| 6,049,851 A | * | 4/2000 | Bryg | G06F 12/0831 711/141 |
| 7,107,367 B1 | * | 9/2006 | Hughes | G06F 13/1673 710/39 |

OTHER PUBLICATIONS

Arm, "Armv8.5—A Memory Tagging Extension", White Paper, 2019, 9 pages.

* cited by examiner

*Primary Examiner* — Phung M Chung
(74) *Attorney, Agent, or Firm* — Nixon & Vanderhye P.C.

(57) ABSTRACT

A requester issues a request specifying a target address indicating an addressed location in a memory system. A completer responds to the request. Tag error checking circuitry performs a tag error checking operation when the request issued by the requester is a tag-error-checking request specifying an address tag. The tag error checking operation comprises determining whether the address tag matches an allocation tag stored in the memory system associated with a block of one or more addresses comprising the target address specified by the tag-error-checking request. The requester and the completer communicate via a memory interface having at least one data signal path to exchange read data or write data between the requester and the completer; and at least one tag signal path, provided in parallel with the at least one data signal path, to exchange address tags or allocation tags between the requester and the completer.

20 Claims, 9 Drawing Sheets

| Data coherency state | Tag coherency state |
| --- | --- |
| Invalid | Invalid |
| Unique, Clean | Unique, [Invalid, Clean or Dirty] |
| Unique, Dirty | Unique, [Invalid, Clean or Dirty] |
| Shared, Clean | Shared, [Invalid, Clean or Dirty] |
| Shared, Dirty | Shared, [Invalid, Clean or Dirty] |

(Valid Data States: Unique Clean, Unique Dirty, Shared Clean, Shared Dirty)

MEMORY INTERFACE HAVING DATA SIGNAL PATH AND TAG SIGNAL PATH

BACKGROUND

Technical Field

The present technique relates to the field of data processing.

Technical Background

Software to be executed by a data processing apparatus may typically be written in a high-level programing language and then compiled into code according to the instruction set architecture supported by the apparatus on which the software is to be executed. For example, the software may originally be written in a higher level language such as Java, C or C++, and then compiled into a natively supported instruction set architecture such as x86 or Arm®.

Some higher level programing languages, such as Java, are considered memory-safe languages because they include run time error detection checks for checking for certain errors relating to memory accesses. In contrast, memory-unsafe languages, such as C and C++, do not include such run time error checks. The enduring prevalence of use of memory-unsafe languages means that in compiled code according to a given instruction set architecture, there may be a large number of memory related errors which may be vulnerable to exploitation by an attacker or other malicious party. Such errors may include:

Bounds violations, in which an array index supplied by the code is outside the legitimate bounds of the array;
Use-after-free errors, in which an access to a memory location is made after that memory location has already been deallocated or freed;
Use-after-return, in which a memory access to an address associated with a variable used within a function (such as a value on a stack) is made after already returning from the function;
Use-out-of-scope errors, in which variables are accessed outside of the scope in which they are declared; and
Use-before-initialisation errors, in which a memory address associated with a variable is accessed before the variable has been initialised.

These are just some examples of memory-related errors which can result in unpredictable behaviour and potentially provide avenues for attackers to exploit. Hence, it may be desirable to provide mechanisms for assisting with runtime detection of certain classes and memory errors.

SUMMARY

At least some examples provide an apparatus comprising:
a requester to issue a request specifying a target address indicating an addressed location in a memory system;
a completer to respond to the request issued by the requester; and
tag error checking circuitry to perform a tag error checking operation when the request issued by the requester is a tag-error-checking request specifying an address tag, the tag error checking operation comprising determining whether the address tag matches an allocation tag stored in the memory system associated with a block of one or more addresses comprising the target address specified by the tag-error-checking request; in which:
the requester and the completer are configured to communicate via a memory interface having at least:
at least one data signal path to exchange read data or write data between the requester and the completer; and
at least one tag signal path, provided in parallel with the at least one data signal path, to exchange address tags or allocation tags between the requester and the completer.

At least some examples provide an apparatus comprising:
means for issuing a request specifying a target address indicating an addressed location in a memory system;
means for responding to the request issued by the means for issuing; and
means for performing a tag error checking operation when the request issued by the means for issuing is a tag-error-checking request specifying an address tag, the tag error checking operation comprising determining whether the address tag matches an allocation tag stored in the memory system associated with a block of one or more addresses comprising the target address specified by the tag-error-checking request; in which:
the means for issuing and the means for responding are configured to communicate via a memory interface having at least:
at least one data signal path to exchange read data or write data between the means for issuing and the means for responding; and
at least one tag signal path, provided in parallel with the at least one data signal path, to exchange address tags or allocation tags between the means for issuing and the means for responding.

At least some examples provide a method comprising:
a requester issuing a request specifying a target address indicating an addressed location in a memory system;
a completer responding to respond to the request issued by the requester; and
when the request issued by the requester is a tag-error-checking request specifying an address tag, performing a tag error checking operation comprising determining whether the address tag matches an allocation tag stored in the memory system associated with a block of one or more addresses comprising the target address specified by the tag-error-checking request; in which:
the requester and the completer communicate via a memory interface having at least:
at least one data signal path to exchange read data or write data between the requester and the completer; and
at least one tag signal path, provided in parallel with the at least one data signal path, to exchange address tags or allocation tags between the requester and the completer.

Further aspects, features and advantages of the present technique will be apparent from the following description of examples, which is to be read in conjunction with the accompanying drawings.

DESCRIPTION OF EXAMPLES

Figure 1:
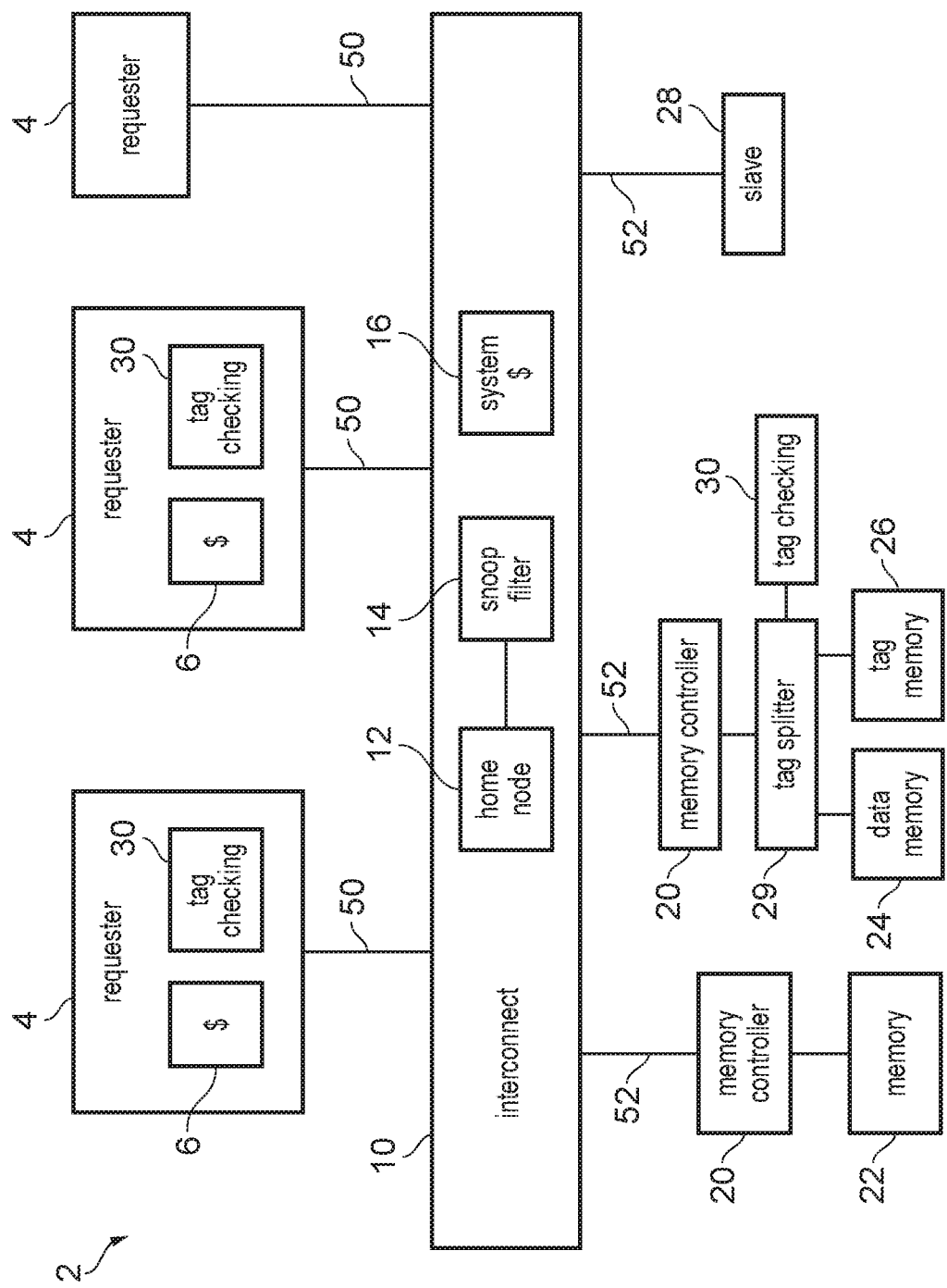
FIG. 1 schematically illustrates a data processing apparatus in which requesters issue requests to access a memory system via a memory interface, and completers respond to the requests.

One approach for protecting against the types of memory usage errors as discussed above may be to provide allocation tags which are stored in the memory system in association with corresponding blocks of addresses. When a tag-error-checking request is issued specifying a target address identifying a particular addressed location of data in the memory system, a tag error checking operation may be performed using a corresponding allocation tag which corresponds to the block of one or more addresses including the target address specified by the tag-error-checking request. The tag-error-checking request could be a request dedicated to checking the allocation tag for a given address (which does not also perform a read or write to the addressed location). Alternatively, the tag-error-checking request could be a read or write request which causes a read or write operation to the addressed location to be performed, as well as the tag error checking operation.

The tag-error-checking request specifies an address tag, and the tag error checking operation comprises determining whether the address tag specified in the request matches the allocation tag stored in the memory system for the block of addresses including the target address. Although it may be possible for allocation tags to be defined for every separate address, in practice to reduce the overhead allocation tags may be shared between a block of multiple addresses. In response to the tag-error-checking request, an indication can then be provided of whether the address tag matched the allocation tag, and this can be used to decide whether to trigger an error reporting action or an error handling response.

This approach can be useful, as for example code based on a memory-unsafe language such as C or C++ can, when initialising regions of memory, set the allocation tags for blocks of memory which the code is expected to use to particular tag values, and may associate the corresponding address tag values with the target addresses which point to those blocks in memory. If a memory usage error occurs, such as the address pointer being used out of scope or extending out of bounds of the valid range which was initialised, then it may be likely that the allocation tag associated with the addressed location that the code tries to access may not match the address tag associated with the target address used by the code to access that address location, and in this case an error handling response or an error reporting mechanism may be reported. The particular response taken can depend on the particular needs of the software being executed or on the particular micro-architectural implementation of the hardware. While it may be possible to signal an exception or trigger some other error handling action, other approaches may be less invasive and may simply log the error in an error log so that subsequent analysis can determine whether any memory-related errors have occurred. It is not essential for a request which fails the tag error check to prevent any associated read/write operation from completing. In some systems, the tag error checking may be intended as a diagnostic mechanism for generating an error log which could be provided to a system operator or software developer, e.g. to allow the software to be updated to prevent such errors in future, rather than necessarily blocking the erroneous memory accesses.

To support the tag error checking, address tag or allocation tag values may pass between a requester which issues requests for accessing addressed locations in the memory system and a completer which responds to the requests. The requester and the completer may communicate via a memory interface using transactions defined according to some memory interface protocol. To expand a memory interface protocol not supporting transfer of tag values to also support tags, one approach could be that additional request types are defined for transfer of tag values, and the tags are provided between the request and the completer over the same data signal path used to exchange read data or write data between the requester and the completer for regular data accesses. While this approach can reduce the width of the channels needed on the memory interface, it may have some disadvantages as this may require two separate requests to issue a data transaction (read or write) and also request a corresponding error checking operation or tag setting/reading operation.

In contrast, in the approach discussed below, the requester and the completer may communicate via a memory interface which has at least one data signal path for exchanging read data or write data between the requester and the completer, and in parallel with the at least one data signal path, at least one tag signal path for exchanging address tags or allocation tags between the requester and the completer. By providing parallel signal paths for the data and tags respectively, this means that a single request is able to transfer or receive both data and tag values in the same request, which can improve performance, reduce memory bandwidth occupied for a given operation involving transfer of both data and tags, and make control of coherency when data or tags are cached at a requester much simpler to control. The provision of a separate tag signal path from the data signal path can also help to improve performance by opening up opportunities to use the spare bandwidth on the tag signal path for additional purposes even if tags are not explicitly required for a given operation requested by the requester.

While it may be possible for some implementations to use a memory interface with a two-way data signal path shared between read requests and write requests and a two-way tag signal path shared between read and write requests, it may be more efficient in some embodiments to provide separate read and write data signal paths and also to provide separate read and write tag signal paths, so that data and tags can be transmitted in both directions between a requester and a completer simultaneously.

The requester may be any circuit or device within a data processing system which is able to issue requests to access an addressed location in a memory system identified by a target address specified in the request. For example the requester could be a processing element such as a central processing unit (CPU) or a graphics processing unit (GPU), or a display controller, network controller, or other master device capable of initiating read or write transactions to memory. The completer could be any device which is able to provide a response to the request, either based entirely on actions performed by the completer, or based at least partially on actions performed by a downstream device which the completer can request to carry out actions in response to the request issued by the requester. For example, in some cases the completer could be a slave device in the memory system, which is not capable of initiating memory access transactions itself but may respond to transactions initiated by a requester. For example the slave device could be a memory controller for controlling access to a corresponding memory device, a peripheral controller for controlling access to a peripheral device, or any other type of slave device. In other examples, the completer could be an intermediate device which may not necessarily control access to the addressed location identified by the target address itself. For example the completer could be a home node or interconnect via which requests from the requester may be routed to various slave devices. The home node or the interconnect could have a system cache which is shared between multiple requesters and sometimes the home node or interconnect may be able to respond to the request issued by a given requester using information in its system cache without needing to go back to main memory. Hence, in some cases the interconnect or the home node could act as the completer. Whether the completer for a given request is the home node or interconnect or is a downstream slave device may therefore depend on the status of information in caches associated with the home node or interconnect.

Also, in some cases the same device within a data processing system may be able to act both as a completer and as a requester, as in some cases a combined completer/requester may provide responses to requests from an upstream requester as well as providing further requests downstream to a downstream completer. Hence, the descriptions of requesters and completers below are intended in the general sense and they refer to any pair of devices which issue a request over the memory interface and respond to the request on the memory interface, but the particular circuits within a data processing system which correspond to the requester or the completer may vary. Also a given system may have many requesters and many completers, and the particular pair of requester-completer may depend on which device issues the request and which target address is specified by the request.

The tag-error-checking circuitry could be associated either with the requester or with the completer, or with another part of the data processing system. If the tag-error-checking circuitry is associated with a requester, then when the requester issues a tag-error-checking request, then the allocation tag for the tag-error-checking operation may be returned to the requester from the completer and the tag-error-checking operation may be performed at the requester. This approach can be particularly useful for read transactions as this may allow the allocation tag associated with the target address to be cached locally at the requester, so that if another request to the same block of addresses is performed then it may not be necessary to obtain the allocation tag from the memory system again. Alternatively, if the tag-error-checking circuitry is at the completer then the address tag for the tag-error-checking operation may be transferred from the requester to the completer so that the completer can carry out the tag-error-checking operation using the transferred address tag and the allocation tag obtained from the memory system. This approach can be particularly useful for write requests because it can reduce propagation delays and because some memory interface protocols may not have a mechanism by which information read from memory can be returned back to the requester in response to a write request, and so it may be easier for the tag-error-checking operation to be performed at the location of the completer. Hence, in some implementations there may be multiple instances of tag-error-checking circuitry provided, with requester tag-error-checking circuitry being provided at the requester for performing tag-error-checking operations for read requests and completer tag-error-checking circuitry being provided for performing the tag-error-checking operation for write requests at the completer.

A request issued by the requester on the memory interface may be associated with a tag operation identifier which indicates how the at least one tag signal path is to be used for that particular request. For example, some memory accesses may not need to be subject to tag-error-checking and so the tag operation identifier can be used to indicate that no tag-error-checking operation is needed. Other requests may specify that the tag-error-checking operation is required. Also, the tag operation identifier could identify whether the request is to be used to read allocation tags from memory via the tag signal path, or to write allocation tags to memory via the at least one tag signal path.

In one example, for a read request issued by the requester to request that read data associated with a target address is transferred to the requester over the at least one data signal path, the tag operation identifier may specify whether the requester is also requesting that at least one corresponding allocation tag should be returned to the requester on the at least one tag signal path. Here, the at least one corresponding allocation tag refers to any one or more allocation tags which are associated with one or more blocks of addresses including at least the block of addresses which comprises the target address of the request. Hence, a requester is able to specify whether it is requesting transfer of data only, or transfer of both data and tags. In some implementations it may also be possible for a read request to request transfer of tags only, for example the read request could specify that tags are to be fetched over the tag signal path, but may indicate that it is not required to provide data over the data signal path.

In one example, when a clean value of the at least one corresponding allocation tag is available to the completer (for example because the at least one corresponding allocation tag has clean values cached in a cache associated with the completer), then the completer may return the at least one corresponding allocation tag to the requester over the at least one tag signal path, even when the tag operation identifier of the request specified that the requester had not requested return of the at least one corresponding allocation tag. It may be seen as counter-intuitive to return clean tag values to a requester when not explicitly requested. However, even if software executing on a processing element issuing the request may not yet have recognised that tag values will be required for a later part of that software, software executing on another processing element may already have recognised that tags are needed for accesses to a given address (for example, memory mapping information stored in page tables shared between the processing elements could define whether accesses to a particular region of memory require tag checking). The inventors recognised that once one agent in a multi-processor system has determined that tag values are needed, then there is a relatively high probability that other agents in the same system can also make use of the tag values, and so the spare bandwidth on the tag signal path can be used to pass clean tag values to the requester even if not explicitly requested. The requester may then be able to allocate the passed allocation tag values into its cache so that if a subsequent request for the same address does require the tag values then request can be handled faster using the locally cached allocation tag values. By returning clean values of allocation tags when not explicitly requested, but not returning dirty tags when not requested, this ensures that the requester has the option of simply discarding the passed tag values if it is not able or willing to make space in its cache for these tag values, without risking loss of dirty information. In contrast, passing of dirty tag values may impose an obligation on the recipient cache to cache those dirty tag values to make sure the most up to date version of the tags is retained.

For write requests issued by a requester to request that a write to the addressed location identified by the target address is performed based on write data transferred on the at least one data signal path, the tag operation identifier may specify whether the requester has also provided at least one corresponding allocation tag on the at least one tag signal path, which could then be written back to memory. Hence, write requests could specify that tags on the tag signal path are to be written back so that allocation tag values in memory can be updated using the same memory request as the request which writes the corresponding data to memory. This may improve performance by reducing the number of requests needed to maintain both data and tags. Again, the memory interface protocol may support write requests which write data only but do not write tags, requests which write tags only but not write data, or requests which write both data and tags.

In one example, the tag operation identifier may have an encoding which identifies whether the at least one corresponding allocation tag provided on the at least one tag signal path for the write request is clean or dirty. Here, a clean tag refers to a tag value which can be discarded without writing it back to the memory system because a corresponding value of the tag associated with the same address is present elsewhere in the memory system and the entity associated with another location has responsibility for writing back the tag value if needed. On the other hand, a dirty tag value is a tag value which would have to be written back to memory if it is evicted from its current location, because the entity associated with the current location of the tag has the responsibility for writing it back. Hence, when dirty tag values are passed on the tag signal path for a given write request, this may be an indication that the dirty value should be written back to a downstream cache or to main memory.

It may seem counter-intuitive that it would be useful to provide an encoding of the tag operation identifier which identifies that one or more clean allocation tag values are being transferred on the tag signal path. One may expect that passing clean tags downstream is unnecessary, because the clean status of the allocation tag will indicate that the most up to date value of that allocation tag is either already present in the memory system or can be obtained from another location, such as another requester's cache. However, again, it is recognised that once one agent in a system has fetched allocation tags into its cache then there may be a relatively high probability that other agents in the system may also be able to make use of the tag values. By passing clean tag values downstream from the requester, this may allow those clean tag values to be allocated into a downstream cache (such as a system cache included in an interconnect), which can make it more likely that if another requester subsequently requests the same tags, they may be present in the system cache. This can improve performance for the other requester. Hence, by providing protocol support for write requests to pass clean values of tags, this can improve overall system performance. It can be useful to indicate whether the passed tag values are clean or dirty because this can allow the entity associated with a downstream cache to decide whether it should allocate space in its cache for the passed tag values. When the passed allocation tag is clean, then although it may benefit other requesters to allocate the clean allocation tag into the downstream cache, it is not essential for the entity controlling the downstream cache to do so, as the allocation tag is clean and so can be discarded without risk of losing the most up to date value of the allocation tag available in the system as a whole. Hence, no additional cost is imposed on other components in the system as a whole due to the requester passing the clean tags downstream speculatively.

For write requests, the request may include an indication of whether the write data for the write request is valid, separate from the tag operation identifier which indicates whether the at least one corresponding allocation tag is clean or dirty. In some implementations the write request may simply identify whether the write data is valid or invalid, and in the case where it is valid the write request may not distinguish whether the write data is clean or dirty (it could be implicit that any valid write data is considered to be dirty). Alternatively, some protocols may further allow valid write data to be explicitly distinguished as clean or dirty (similar to the tags described above). Either way, by having a valid indication for the write data, separate from the indication of whether the tag is clean or dirty, this can allow downstream components to decide whether the write request needs write operations to be triggered for both the data and the tag.

One possible implementation of storing tags in memory may be that the system may include separate tag memory storage, which may not be accessible through regular memory addresses within the same address space as the data, and a tag splitting component could split write requests specifying a target address into separate tag and data memory accesses for updating the allocation tag and data associated with the target address respectively. With this approach, tag and data writes may, in the portion of the system upstream of the tag splitting component, effectively be treated as a single request, but downstream from the tag splitting component they may be viewed as separate accesses to different parts of memory. In an implementation which handles the tag storage in this manner, it can be useful to be able to separately identify whether the write data is valid and also whether the at least one corresponding allocation tag is clean or dirty. In this case, then when the write data is invalid but the at least one corresponding allocation tag is dirty, the tag splitting component could choose not to issue any data write request but only to issue a tag write request to write the dirty tag to memory. Conversely, if the write data for a given write request is valid but the at least one corresponding allocation tag is clean, then the tag splitting component could decide to omit the tag write operation and only issue a data write operation to write the write data to the addressed location in memory associated with the target address.

Of course, it will be appreciated that the particular way in which tags are stored in memory may vary from implementation to implementation, so it is not essential for a system to include a tag splitting component in this way, and other implementations may choose to store the allocation tag associated with a given memory address in another region of the same address space as the address of the data itself, with a component mapping the write request to respective tag and data addresses in the same address space respectively. For example, the tag for a block of addresses could be stored alongside the corresponding data. Nevertheless, by providing a memory interface protocol which has a separate write data valid indicator and tag clean/dirty identifier, this can support those implementations which do choose to split tag and data values into separate memories as discussed above.

In some implementations, memory transfers between different components of the memory system may be controlled in units of a particular size, which may be called a "cache line". Coherency between cached data may also be controlled in units of a cache line. For example, the term "cache line" may refer to the size of the block of data which corresponds to the width of the data channel on the memory interface.

In some examples, the memory interface protocol may support at least one type of write request which specifies that at least one dirty allocation tag for an address block including the target address should be written to the memory system. For such a write request, the write request may specify an indication of whether all the allocation tags associated with a group of blocks of addresses corresponding to the same cache line are all to be updated in response to that write request. The indication of which tags are to be updated could be done through a tag enable field which may specify a number of enable bits separately indicating which particular tags are to be updated. However, another approach can be to define a dedicated request type, where a particular value of a request type field identifies that this request is updating all the allocation tags associated with a given cache line (as opposed to the other request types which may be used for tag updates for only part of a cache line). This can be useful because it may allow simpler coherency actions to be taken in response to the full-cache-line-tag-updating write request. If all the tags associated with the same cache line of data are to be updated, then if any caches within the system currently store dirty allocation tag values for that cache line then these can simply be invalidated without needing to return the dirty values to a home node for maintaining coherency.

Different variants of full-cache-line update requests can be provided, identifying separately whether the data for the entire cache line is to be updated in response to the request and/or whether the allocation tags for the entire cache line are to be updated. Hence, a first version could identify that all the data in the same cache line is to be updated but may allow a partial update (or no update at all) to the corresponding allocation tags for the cache line. A second version of the write request could allow for only a partial update (or no update at all) for the data in the cache line, but indicate that all the corresponding tags for that cache line should be updated. A third version of the full-line write request could specify that both the data and the allocation tags should be fully updated for the entire cache line. By providing protocol support for identifying requests which update all the data and/or tags in the same cache line, this can reduce the number of snoop operations which need to be handled by a home node for managing coherency.

Another use of the tag operation identifier can be to indicate whether a given request is a tag-error-checking request which requires the tag error checking operation to be performed as described above. In implementations where the completer performs the tag error checking operation for write requests and the requester performs the tag error checking operation for read requests, it may not be necessary for read requests to specify whether they are a tag-error-checking request, as it instead may be possible simply for allocation tag values to be returned in a tag read request, and then a separate tag error checking operation can be performed by the tag error checking circuitry at the requester to check those allocation tags against address tags associated with corresponding addresses. However, for write requests, it can be particularly useful for the tag operation identifier to identify whether the write request is a tag-error-checking request. If so, then the completer responds to the tag-error-checking write request by controlling the tag error checking circuitry to perform the tag error checking operation using, as the address tag for the tag error checking operation, a tag value transferred from the requester over the at least one tag signal path.

When a write request is specified as a tag error checking request, then it may have requested that write data is written to memory, as well as requesting that the tag error checking operation is performed. Hence, the completer may provide a write response to the requester, in response to the write request. For example, the write response may acknowledge that the write request has been received, or could be used to signal that the write operation has completed to a given point so that the requester can be confident that it has been actioned. Such write responses may be used to ensure memory consistency by ensuring that dependent operations are not triggered until the write response for an earlier write has been received, or for enforcement of memory barriers. Handling of such write responses can be important for dealing with issues such as hazards and ordering requirements.

In some implementations, an indication of whether the tag error checking operation identified a match or a mismatch between the address tag and the allocation tag could be included in the write response itself. Hence, a single response could be provided indicating both some write response information the same as would be provided for a normal non-tag-error-checking write, and also including a tag match indication which allows the requester to understand whether any memory-related error has been identified due to the mismatching of the address tag and the allocation tag. However, a problem with this approach may be that while the completer may have been able to action the write operation to write the write data to memory, sometimes checking the address tag against the allocation tag may require the allocation tag to be read from memory which may be slower. The latency of the error checking operation may depend on the location at which the allocation tag is stored. As there may be operations on the critical path of processing at the requester which are waiting for the write response before they can proceed, it may be undesirable to delay providing the write response merely because the tag error checking operation has not yet been performed due to waiting for the allocation tag to be available.

Therefore, in some implementations of the protocol, the protocol may support providing a tag match response in response to a write request specified as the tag error checking request, where the tag match response is separate from a write response provided in response to the write request. This tag match response may indicate whether the tag error checking operation identified a match between the address tag and the allocation tag. By providing support for a separate tag match response, this means that the write response can be provided as soon as the write operation has completed to a given point, however it is not necessary to delay the write response due to the slower tag error checking operation. This can improve system performance. It may seem counter-intuitive that, if a memory error has been identified, it may be acceptable to allow the write response to be generated and subsequent operations to continue. However, in practice the tag checking operations may not be intended to block requests which access memory in violation of the allocation tag provided for protecting the memory accesses. In some implementations, the tag checking may simply be used to provide an error log indicating possible errors that may have occurred when accessing memory, which can be then reported to a monitoring party to decide whether to take account of those errors. For example, an error log returned from a device could be used by a software developer to determine whether to issue a patch for the software, rather than interrupting the functioning of the device when the software is actually being executed on the device. Hence, it is not essential that processing is halted when an error is detected or that writes with mismatching tags are prevented from being serviced. Therefore, it may be acceptable for tag match responses to be separated from the corresponding write response and therefore providing separate response types for the write response and the tag match response can improve system performance by preventing a slower tag error check from delaying the write response.

In some protocol implementations, two versions of a write response may be supported: a first version which includes the tag match indication (and can be used if the tag checking result is available when the write is complete) and a second version which omits the tag checking result if it is not yet available when the write is complete. Hence, if the tag checking result is already available, the first version can be used so there is no need to issue a separate tag match response, saving memory interface bandwidth, but if the tag checking result is not yet available when the write is complete then the second version of the write response can be issued to avoid delaying subsequent dependent operations and the tag match response can follow later.

In one example, the tag-error-checking request may specify a group identifier identifying a group of requests to which the tag-error-checking request belongs. The completer may specify, in the tag match response, a corresponding group identifier which matches the group identifier included in the tag-error-checking request that triggered that tag match response to be generated. By including a group identifier in tag match responses, this can simplify the requester's tracking of whether the tag-error-checking operation identified a tag mismatch for any of a group of requests issued to the completer. For example, for some approaches it may not be essential to know exactly which particular request encountered a tag error, and instead some error logging approaches may simply wish to identify whether any one or more requests identified a tag mismatch, or could simply provide a count of the total number of requests that triggered a tag match response indicating that an error was identified. Without a group identifier determining whether tag match responses have been received for a group of issued tag error checking requests may require comparison of request identifiers for individual requests, which may require a much greater amount of tracking circuitry at the requester. By including a group identifier, it is possible to count the incoming tag match responses for a given group of requests using a single counter, so that it is much less expensive in hardware to track the tag match responses for the group of requests. In some implementations, in a multi-processor system each CPU could simply have a different group identifier allocated to it and all the requests issued by a given CPU may share the same group identifier, so that the tracking of tag match responses is performed per processor. Other approaches may allow processors to partition its requests into multiple different groups, with separate group identifier counters. Either way, this is a much simpler approach to tracking, compared to an approach where requests and tag match responses are matched based on individual transaction identifiers, which would typically require very long lists of the outstanding unique transaction identifiers to be maintained by each requester.

Another type of request that can be issued by a requester may be a stashing request which requests that data associated with the target request is to be allocated to a stashing target cache other than a cache associated with the requester itself. For example, one requester (e.g. a work controller which controls workloads to be performed by other requesters within the processing system) may be aware that another requester is likely to need data from a particular address, and so can issue a stashing request requesting that the data from that address is brought into that other requester's cache ahead of time to try to ensure lower access latency when the other requester then subsequently comes to use that particular piece of data. For stashing requests, the tag operation identifier may specify whether at least one corresponding allocation tag should also be provided by the completer to the stashing target cache, in addition to the data to be stashed. It can be useful for the requester issuing the stashing request to signal whether tags are likely to be required for the stashed data, because when the data is not already cached within the stashing target cache then the entity associated with the stashing target cache is unlikely to have any information about whether it previously used any related tags for that particular address. Hence, rather than allowing the stashee entity associated with the stashing target cache to decide whether to obtain tags, the stashing request provided by the requester may specify a tag operation identifier specifying whether an allocation tag should be provided by the completer along with the data.

However, as the stashing request is merely a hint that some data may be useful in future for the stashee associated with the stashing target cache, it is not essential for any data or allocation tags provided by the completer to actually be allocated into the stashing target cache as a consequence of the stashing request. It may be that the stashee entity has other data or tags cached which it does not wish to evict. To ensure that the stashee entity is able to discard tags passed in the stashing operation if it prefers, then the completer may ensure that it does not provide any dirty allocation tags to the stashing target cache in response to the stashing request. Hence, when a version of the at least one corresponding allocation tag available to the completer is dirty, the completer may suppress transfer of the at least one corresponding allocation tag to the stashing target cache in a dirty state, even when the tag operation identifier specifies that the stashing target allocation tag should be transferred to the stashing target cache. By providing only clean allocation tags in response to the stashing requests, this means that if the stashee cannot safely accept the tags provided then they can be safely dropped without risking loss of the latest version of the tags. In some implementations, if the completer holds dirty tags, the completer could simply not forward any tags to the stashee, and continue to hold the dirty tags. In other implementations, if the completer holds dirty tags, the completer may clean the tags (e.g. by issuing a writeback to memory) and forward the clean tags to the stashee in response to the stashing request. Other implementations may support both options, allowing the completer to decide what to do with dirty tags on receipt of a corresponding stashing request. Hence, suppressing transfer of the tags in a dirty state can be done either by not transferring them at all, or by first cleaning the tags and transferring them in a clean state.

On the other hand, in cases where the requester has signalled that the at least one corresponding allocation tag should not be transferred to the stashing target cache and a clean version of the at least one corresponding allocation tag is available in a cache associated with the completer, the completer may transfer the at least one corresponding allocation tag to the stashing target cache despite the fact that this was not requested by the requester. Again, this recognises that if the completer has cached allocation tags available, then this means that at least one entity in the data processing system has previously found those tags useful, and so there is a reasonable probability that another entity could also use the same tags. Therefore, it may be beneficial to provide the at least one corresponding allocation tag for the specified addresses to the stashing target cache, even though this was not explicitly requested by the requester which issued the stashing request. For example the requester may not yet have realised that the addresses associated with the stashing request are from a region of memory which requires tag-guarded accesses using the tag checking operation, but another entity may have detected that the addresses are in such a tag-guarded memory region, and so if the tags are available at little cost within a cache local to the completer then it may be more efficient for these to be provided to the stashing target cache even if not requested.

As discussed above, when the requester wishes to write data and/or tags to the memory system, it can do this through a single write request. The single request may provide valid data only, valid tags only, or both valid data and valid tags to be written back. In a relatively simple implementation, if only tags are to be updated in memory, then this may be done via the tag signal path and the data signal path may be unused. This may be simpler to implement in hardware as it may not be needed to provide circuit logic which can read tag values from the data signal path. However, the data signal path is often wider than the tag signal path. Hence, if many allocation tags need to be written to memory then it may be relatively slow to perform tag transfer solely using the at least one tag signal path.

Hence, in some embodiments the protocol may support a bulk tag transfer request, for which the requester and the completer may exchange a group of allocation tag values associated with adjacent blocks of addresses using the at least one data signal path. This approach can allow a greater number of tags to be updated in response to a single request, so that fewer requests are needed to update a certain number of allocation tags in memory. In other words, the bulk tag transfer request makes use of the fact that there is spare bandwidth on the data signal path when only tags need to be updated.

Some implementations may provide a home node which controls coherency of data and/or allocation tag values stored in caches of at least one requester. The home node may use a particular coherency protocol to manage the coherency between the cached data values and allocation tag values in the respective caches of one or more requesters. This coherency protocol may define certain coherency states for data and/or allocation tag values, and may define a set of transitions of between coherency states which may occur when certain types of requests are processed. The coherency protocol may also define snoop requests which can be sent by the home node to a given requester to query information about the coherency state of data values and/or allocation tag values stored for a given address within the cache of that requester, and snoop responses to such snoop requests sent from a snooped requester to the home node, which the home node can use to determine how to respond to the request sent by an initiating requester which caused that snoop to be issued.

In some examples, the coherency for the cached data values and the cached allocation tag values stored in a cache of the requester may be controlled based on a combined coherency protocol which defines a common set of coherency state transitions for the cached data value and the associated cached allocation tag for a given address. That is, rather than managing a first set of coherency state transitions for cached data values and a separate second set of coherency state transitions for cached allocation tag values, instead a common set of coherency state transitions may be defined for both data and tags. This can make control of coherency much simpler to implement in hardware and also reduces the development cost for developing a system supporting tags, when a coherency protocol is already available for handling data. For example, by using a combined coherency protocol, this avoids the need to duplicate components such as a snoop filter for managing coherency.

One aspect of the coherency protocol may be that for a given cached data value and allocation tag, the coherency protocol defines a unique/shared coherency status. When the unique/shared coherency status is unique, this means that a requester caching a cached data value and allocation tag is allowed to locally update in its own cache the cached data value or allocation tag for the given address without checking with the home node. On the other hand, when the unique/shared coherency status is shared, this means the requester is required to check with the home node before it performs a local update in its cache. In the combined coherency protocol, a constraint may be imposed which requires both the cached data value and the cached allocation tag for the given address to have the same unique/shared coherency status. This recognises that, in practice, it may be relatively unlikely that multiple entities in a system need to share access to the data but not share the corresponding tag, or vice versa, and so additional circuit overhead in maintaining separate unique/shared coherency status for data and tags respectively may be unjustified. A simpler coherency protocol can be used if the data and the related allocation tag for a given address are always considered to have the same unique/shared coherency status.

Nevertheless, the combined coherency protocol may still permit the cached data value to have a different clean/dirty coherency status to the cached allocation tag value. The support for different clean/dirty status for tags compared to data can be useful to permit tag splitting components as discussed above to suppress either the data writes or the tag writes, to improve memory system performance. Hence, incurring a little additional circuit overhead in supporting a coherency scheme which enables separate clean and dirty indications may be justified. This approach also means that it is possible for requesters to independently update only the cached data value and not the tag or vice versa within their local cache, as the separate clean/dirty values can be used to track which of the data/tag has been updated relative to memory. Also, providing separate clean/dirty status for data and tags can also allow intervening nodes between the requester and the completer to make more informed decisions on whether to allocate data or tag values to its cache or on whether snoop requests are required to other entities.

Hence, in summary there may a single unique/shared coherency status indication for both the data and tag, but there may be separate identifiers which separately identify the data clean/dirty status and tag clean/dirty status. Also there could be separate validity indicators indicating whether data and tags are valid respectively. In some cases, cached tags may be constrained to be valid only when the corresponding cached data is valid.

FIG. 1 illustrates an example of a data processing system 2 which has a number of requesters 4 which can request access to a memory system. Some of the requesters may have a cache 6 (or multiple caches in some cases). Other requesters 4 may not have a cache at all. The requesters 4 communicate via an interconnect 10 which controls access to underlying memory and also may maintain coherency between information cached in respective caches 6 of the requesters 4. That is, the interconnect 10 may act as a home node 12 providing a point of coherency, which coordinates information stored in the respective caches so that only one of the caches 6 can store a dirty copy of information from a given address at a time, a read from a given requester 4 returns the most up to date value available (whether from another requester's cache, or a shared cache 16 or main memory 22,24) and if a requester 4 writes dirty information to its own cache then any cached copy elsewhere is cleaned or invalidated. The home node 12 may operate according to a coherency protocol which defines certain coherency states for information cached in the respective caches 6 of the requesters 4. When an initiating requester 4 issues a read or write request to a target address, the home node 12 may issue snoop requests to other requesters to query and/or change the coherency state of information held in the snooped requester's caches 6, and use responses to the snoop requests to determine how to process the read or write request and respond to the initiating requester 4. In some examples the home node 12 may maintain a snoop filter 14 which at least partially tracks which addresses have information cached in local caches 6 for the different requesters 4. The snoop filter 14 may not track the occupancy of the local requester caches 6 precisely, such that while it may allow false positives (where the snoop filter 14 indicates that information is cached in the cache 6 of a particular requester 4 when that requester has actually evicted that information from its cache), the snoop filter may not permit any false negatives (when the snoop filter does not identify that a particular requester has cached information from a given address but that requester does actually have the information in its cache). Based on the snoop filter 14, the home node 12 can determine not to issue a snoop request to a particular requester 4 if the snoop filter 14 indicates that the corresponding information is not cached in that requester's local cache 6. The interconnect 10 may also have a system cache 16 which provides some shared cache storage shared between the respective requesters 4, which can provide faster access to information than if information has to be obtained from underlying memory. While the snoop filter 14 and system cache 16 are shown as separate in FIG. 1, these could be combined into a single storage structure in some implementations.

When information required by one of the requesters is not present in any of the caches 6, 16 then read requests may be sent to one of the slave devices 20, 28 coupled to the interconnect 10. For example the slave devices could include one or more memory controllers 20 for controlling access to memory devices 22, 24, 26. Also other types of slave device 28 may be coupled to the interconnect 10, such as input/output controllers for handling input or output of data to external devices or peripheral controllers. It will be appreciated that the particular design of the data processing system 2 shown in FIG. 1 is just one example and a wide variety of topologies of different requesters 4, slaves 20, 28 and other devices may be connected via one or more interconnects 10.

Figure 2:
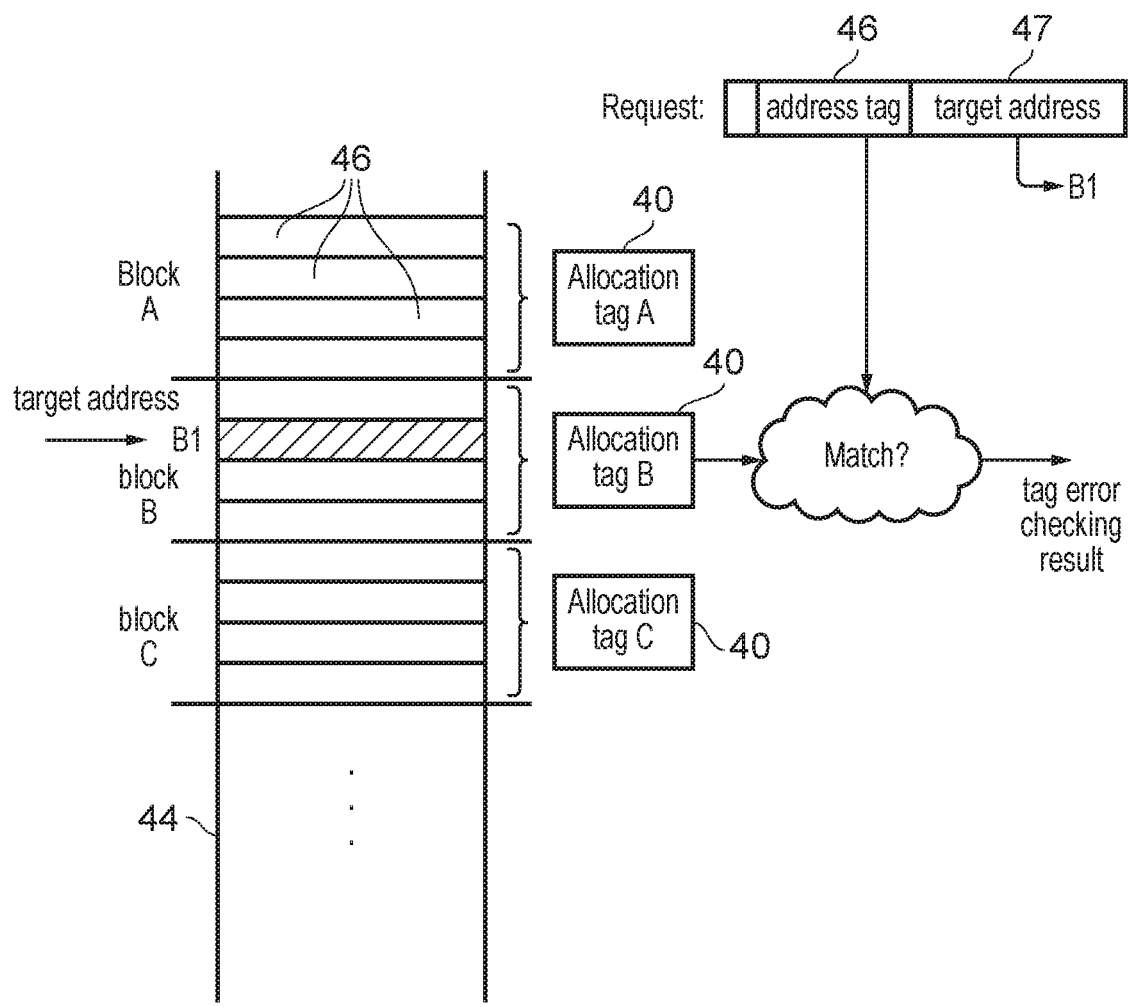
FIG. 2 schematically illustrates an example of a tag error checking operation.

As shown in FIG. 1, some of the requesters 4 may have tag checking circuitry 30 for performing tag checking operations to detect certain types of memory usage errors. Also, some slave devices, such as a memory controller 20 or tag splitting component 29 discussed below, may be provided with tag checking circuitry 30. FIG. 2 illustrates an example of a tag checking operation that can be performed by the tag checking circuitry 30. The tag checking operation is used to support memory tagging which is a mechanism that can be used to check the correct usage of data held in memory. When a block of memory locations is allocated for a particular use, it can be assigned a corresponding allocation tag 40 as shown in FIG. 2. In the example of FIG. 2, four adjacent memory locations share the same allocation tag 40. The allocation tags 40 could be stored at addresses within the same address space as the data locations 42, or could be defined in a completely separate memory and may not be addressable within the address space 44 used to provide the addresses used to identify the actual data values. For example, in the approach shown in FIG. 1, a given memory device may store the tag values in a separate tag memory 26, separate from the data memory 24 which stores the data values themselves. In this case, then when allocation tags 40 stored in the tag memory 26 need to be read or updated, the requester 4 issues tag read/write transactions which specify as their target address the same target address which would be used to access the corresponding location 42 in the data memory 24, but a tag splitter 29 provided within the data processing apparatus 2 may partition the request into separate data and tag access requests for targeting the data 42 in the data memory 24 and the allocation tag 40 in the tag memory 26 respectively. While FIG. 1 shows the tag splitter 29 being downstream from a corresponding memory controller 20, in other examples a tag splitter could be upstream of the memory controller 20 and separate memory controllers could be provided for the data memory 24 and the tag memory 26 respectively. The tag splitter 29 is not essential and other examples could associate the tags 40 with the data in a different way.

Hence, an allocation tag can be associated with a block of memory locations. Later, when the data memory location 42 is accessed, the requester may provide both a target address 47 identifying the data storage location 42 and an address tag value 46 which the requester believes is associated with the memory location. For any access where tag checking is enabled, the address tag 46 included with a request may be checked against the allocation tag 40 stored in the memory system for the block of memory locations 42 including the addressed memory location targeted by the request. For example in FIG. 2, the target address 47 of the request identifies a certain data location B1 within a block B of data locations, and so the address tag 46 is compared with the corresponding allocation tag B 40 defined for that block of locations. When a match between the allocation tag 40 and the address tag 46 is encountered then the access may progress as normal. When the address tag 46 and the allocation tag 40 do not match then an error condition may be signalled and some error reporting action or response action can then be taken. This mechanism means that a memory access can be constrained to be for its expected purpose rather than an erroneous or malicious access. It can be used at run time to identify many common programming memory errors such as buffer overflows, use after free, and the other types of errors discussed above.

Note that the address tag 46 specified in the request does not influence which data location is accessed by the request. A given block of data locations may have its allocation tags set to any arbitrary value by the software allocating memory (typically, allocation tags for consecutive allocations may be set to different values to allow overflow to be detected as a tag mismatch). Hence, when a tag-error-checking request is processed, the addressed location B1 selected for the data read/write operation is selected based on the target address 47, independent of the address tag 46.

Allocation tag values 40 may be cached within respective caches 6, 16 in the data processing system. When allocation tags for read information are cached in the local cache 6 of a requester 4, then if that information is accessed again then the tag error checking operation for comparing the address tag 46 with the allocation tag 40 can be done by the tag checking circuitry 30 within the requester 4. For write operations it may be more efficient for the tag checking operation to be performed by tag checking circuitry 30 associated with the tag splitter 29 or other component closer to the completer which acts upon the write request sent by the requester 4.

Here, the term "completer" refers to any component of the system which generates a response to a request issued a requester 4. In some cases the completer may be within the interconnect 10, such as the home node 12, or the system cache 16. For example, if requested data is present within the system cache 16, then the interconnect 10 may be able to act as completer for the request and reply to the requester 4 with the data read from the system cache 16. In other examples, if a request cannot be serviced within the interconnect 10 then the completer may be a downstream component such as the memory controller 20 or slave device 28. Hence, the completer may be different for different requests issued from the same requester 4, depending on the particular address specified as the target address of the request and where that information associated with the requested address is cached within the system.

The requester 4 may communicate with the interconnect 10 via a requester memory interface 50 which is designed according to a particular memory interface protocol which governs the format of requests and responses sent over the interface, and which may define the coherency protocol to be used by the local caches 6 in the requester 4 and the home node 12 within the interconnect 10, and may define rules for generating particular responses to messages sent over the interface 50. Similarly, the interconnect 10 may connect with slave devices 20, 28 using a slave memory interface 52 also designed according to the same memory interface protocol.

Figure 3:
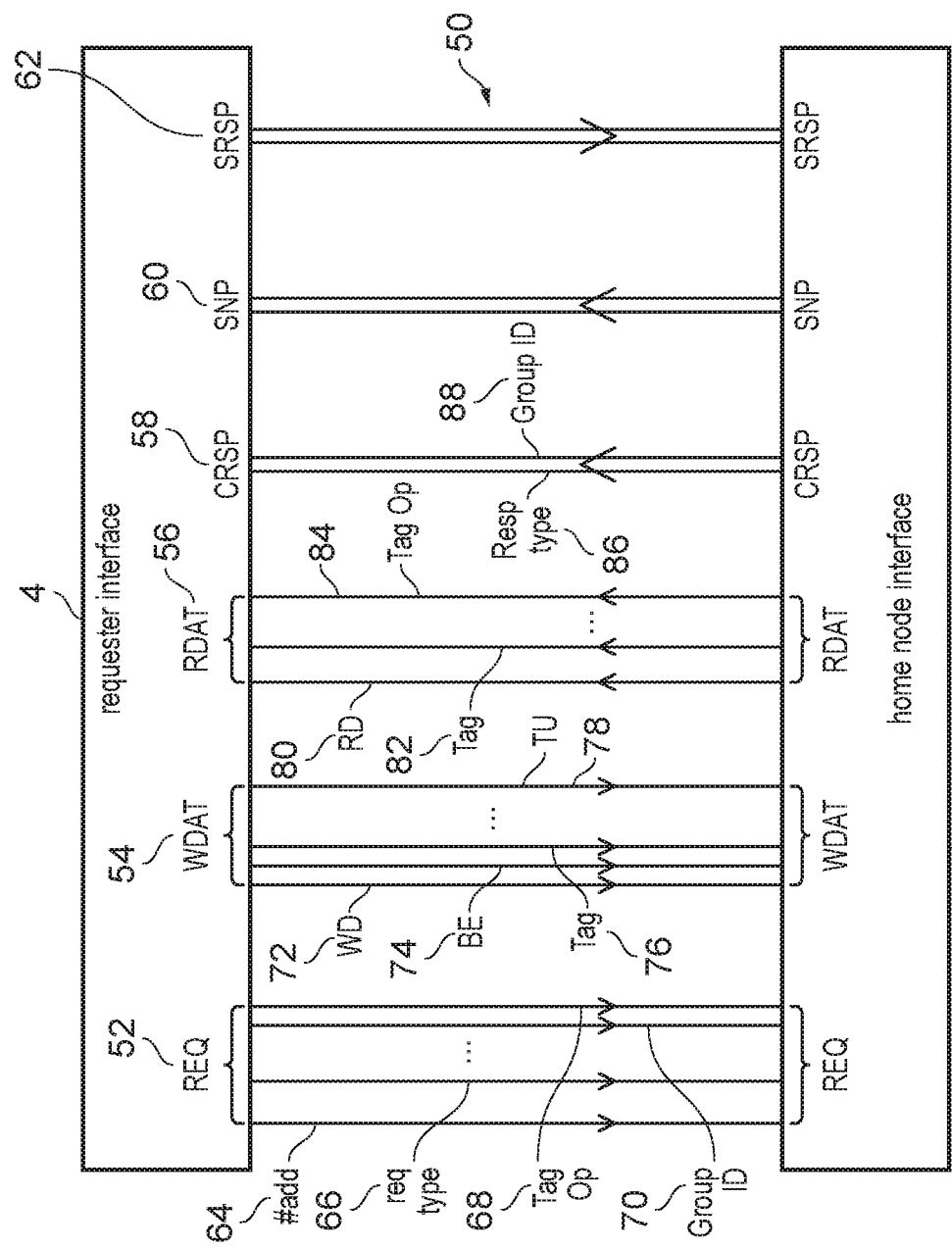
FIG. 3 shows an example of a memory interface between a requester and a home node.

FIG. 3 shows an example of the memory interface 50 between a requester 4 and the home node 12. The memory interface 50 includes a number of channels including a request channel 52, a write data channel 54, a read data channel 56, a completer response channel 58, a snoop channel 60 and a snoop response channel 62.

The request channel 52 is used to provide requests transmitted from the requester 4 to the home node 12, and specifies a number of parameters associated with the request, including a target address 64 identifying the addressed memory location for which a read or write operation is required, a request type identifier 66 identifying the type of request, a tag operation identifier 68 identifying how tag signal paths of the interface 50 are to be used for this request and a group identifier 70 identifying a group of requests to which this request belongs, which can be used for some types of requests to manage tracking of responses to a group of requests. It will be appreciated that this is just a subset of the information which could be transmitted over the request channel 52, and other implementations may provide many other parameters for requests.

The write data channel 54 is used to transmit write data 72 from the requester 4 to the home node 12. Write requests for writing information to the addressed memory location identified by the target address 64 transmit their write data over a write signal path 72 of the write data channel 54. Different types of write request may be defined (distinguished by their request type 66) which control exactly how the write data 72 influences the operation performed on memory. In some instances, not all of the data on the write data signal path 72 may be valid, and an enable value 74 may specify which portions (bytes) of the write data are valid, so that invalid portions of write data are not written to the corresponding location in memory. Also, the write data channel 54 may have a tag signal path 76 for providing address tags or allocation tags from the requester 4 to the completer, and a corresponding tag update (TU) value 78 which indicates which particular tags on the tag signal path 76 are valid. This reflects the fact that memory transfers may be organised in units of a certain size called a cache line and the requester may not have valid tag values for every block of addresses within the cache line. Again, the write data channel may include other information other than the information 72, 74, 76, 78 shown in the example of FIG. 3. However, note that the tag signal path 76 is provided separate from the write data signal path 72, as a parallel signal path 76 which can provide tag information simultaneously to the write data on the write data signal path 72.

The read data channel 56 is used to provide read data from the home node 12 or interconnect 10 to the requester 4, which has been obtained based on a read operation for the addressed memory location identified by the target address 64. The read data is sent over a read data signal path 80. The read data channel 56 also includes a tag signal path 82 which can be used to transfer allocation tags read from memory to a requester 4, so that the requester 4 can perform a tag checking operation on the allocation tags and cache the allocation tags in its cache 6. The read data channel 56 also includes a tag operation identifier field 84 which can provide information on the status of the allocation tags returned on the tag signal path 82. Again, the read data channel 56 could include other information not shown in FIG. 3.

The completer response channel 58 is used by a completer to provide a response to a request issued by the requester 52 on the request channel. For example, the completer response channel 58 may be used to provide a read response signalling that valid read data is being returned on the read data channel 56, or a write response acknowledging a write request made by the requester and confirming that it has either been completed already, or has progressed to a certain stage of processing the write. The completer response channel 58 may specify a response type 86 as well as a group identifier 88 (included for certain types of transaction responses) which may correspond with the group identifier 70 included in the corresponding request, to allow the requester to track completion of groups of requests. For one particular type of response, the completion response channel 58 can be used to signal outcomes of tag checking operations performed by the tag checking circuitry 30 of a completer, as will be discussed further below.

The snoop request channel 60 provides snoop requests from the home node 12 to a snooped requester 4 (other than the requester which issued the read/write request that triggered the snoop) for checking or changing the coherency state of data cached at the snooped requester's cache 6. The snoop response channel 62 provides a response to the snoop requests, for example, indicating the coherency state of information from a given address and/or returning data values from the cache 6 to the home node 12 (for example if the cached data was dirty). In other examples, data values returned in response to a snoop could be transmitted over the write data signal path 72.

It will be appreciated that the different channels 52, 54, 56, 58, 60, 62 shown in FIG. 3 are just one example, and other implementations may provide additional channels or fewer channels. Also the particular division between the signals included in each channel may be considered to be arbitrary, and other approaches may for example consider the tag operation identifier 84 of the read data channel 56 to instead be part of the completion response channel 58. Some implementations could provide a dedicated tag channel dedicated to exchange of tag values or tag operation identifiers.

The slave memory interfaces 52 between the interconnect 10 and the slave devices 20, 28 may be similar to the master memory interfaces shown in FIG. 3, except that there may be no need for a snoop request channel 60 and snoop response channel 62 on the slave interfaces.

Figures 4, 5:
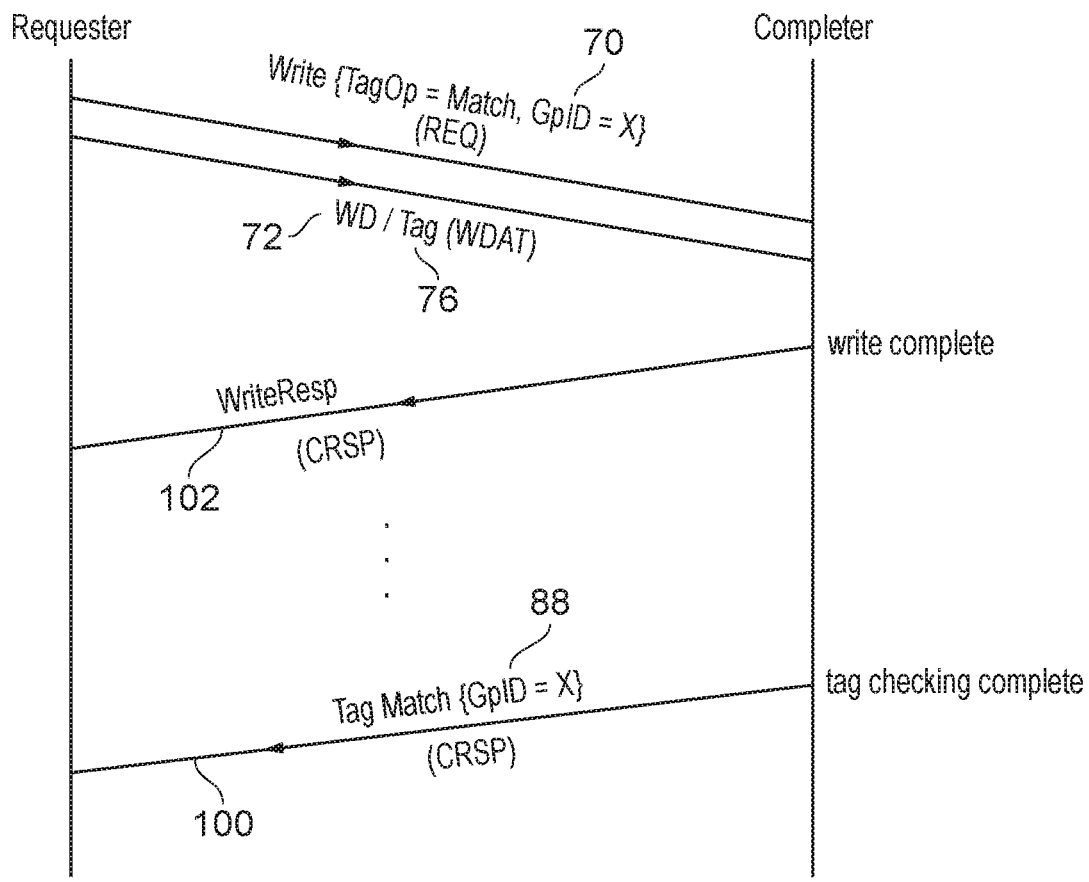
FIG. 4 is a table showing coherency states associated with data and tags.
FIG. 5 schematically illustrates an example of a tag match response being provided separately from a write response for a tag-error-checking write request.

FIG. 4 is a table showing different coherency states which can be provided for data and allocation tag values cached in a given cache 6, 16. The coherency of the data and tags for a given address are controlled according to a combined coherency protocol by the home node 12 based on a common set of coherency state transitions as defined by the memory interface protocol used. To simplify the protocol, the coherency states which can be associated with a cached allocation tag value are constrained based on the corresponding data coherency state.

The data coherency state may be invalid, indicating that there is no valid data from the given address cached in the cache 6 of a particular requester 4. When the data coherency state for a given address is invalid for a particular cache 6, then the tag coherency state for that cache 6 may be constrained to also be invalid, so it is not possible for a cache 6 to cache valid tags for an address which does not also have valid data cached.

When valid, the data coherency state may be in one of a number of other states which define two orthogonal properties for cached data. One of these properties is a unique/shared status which indicates whether the particular cache 6 in a given requester 4 holds unique access to that cached information or is sharing access to that cached information with other requesters 4. When data is held in the unique state, the requester owning that cache 6 is allowed to write to the cached data locally within its own cache 6 without issuing any request to the interconnect 10 to check with the home node 12 whether such writes are allowed. Only one requester 4 is allowed to hold data from a given address in the unique state at a time, and when one requester 4 holds data in the unique state then this implies that no other requesters are allowed to hold a cached copy of the data. On the other hand, when data is cached in the shared state, then this means that it is possible that other caches in the system may have a copy of the data from the same address, and so if the requester 4 associated within a given cache 6 wishes to write to data cached in the shared state, a request needs to be sent to the interconnect 10 and this will trigger snoops by the home node 12 to other requesters 4 to invalidate other cached copies of data from the same address if necessary.

In the combined coherency protocol for data and tags, when the data is held in a unique state, then the coherency protocol constrains the tags to also be in the unique state, and when the data is held in a shared coherency state then the tags are also constrained to be in the shared coherency state. Hence, it is not possible for the data to be held in a unique state when the tags are held in the shared state or vice versa. This makes the coherency protocol used by the home node 12 much simpler as a unified set of coherency states transitions relating to unique and shared can be used for both data and related tags, so that an existing coherency protocol designed for data only can also be applied to the tags.

However, the coherency protocol may support different indications of coherency state for the data and tags in regards to whether the data and tags are clean or dirty, when valid data and tags are cached. When data or an allocation tag in a cache 6 at a given requester 4 is cached in a clean state, this indicates that the given requester 4 does not have responsibility for writing back the data to the memory system when it evicts that data from the cache 6. Data can be cached as clean either because the requester's copy of the data is the same as the underlying data in the corresponding location in memory, or because although the data in the requester's local cache 6 may differ from the underlying data in memory 22, 24, another requester has the responsibility for writing back the dirty data. On the other hand, the dirty coherency state indicates that the requester having the cache 6 which contains the dirty data in the dirty coherency state should write back its data to memory when evicting the data, as any other cached copies for the same address would be in the clean state.

Hence, the data coherency states may be invalid or may define valid states using a pair of properties, on the one hand unique/shared, and on the other hand clean or dirty, so as to define five data coherency states, namely Invalid, UniqueClean, UniqueDirty, SharedClean and SharedDirty. Of course it will be appreciated that this is just one possible coherency scheme which could be used, and other schemes may define other sets of coherency states.

For the corresponding tag coherency states, when the data for a given address is valid and so is in any state other than invalid, then the tag coherency state shares the same property for unique or shared, but may have either the same or a different property for clean and dirty, or alternatively it is possible that the tag coherency state may be invalid while the data coherency state is valid, if there are no cached tag values corresponding to the address of cached data. Hence, in one example, the cached entry for a given data and tag may specify a data coherency state identifier which distinguishes which of the five data coherency states shown in FIG. 4 is represented, and a further tag coherency state identifier which distinguishes, when the data is in one of the valid coherency states, whether the corresponding allocation tag entry in the cache is invalid, clean or dirty.

That is, for a given cache line in a local cache 6 of a requester, it is possible for the data values associated with that cache line to be updated independently from the tag values. A combined coherency protocol is used to simplify the coherency protocol and to avoid the duplication of components responsible for managing the coherency protocol, such as the snoop filter 14 which is responsible for tracking cache line states. The simplified coherency protocol uses the following constraints on the combination of data cache state and tag cache state:

Tags can be Valid only when data is Valid.

Tags can be Invalid when data is Valid.

When a cache line is in a Unique state, it applies to both data and Tags.

When a cache line is in a Shared state, it applies to both data and Tags.

When a cache line with Dirty Tags are evicted then
  Both data and Tags are Dirty.
  The Tags should either be written back to memory or passed Dirty by Home node to another cache.

When Clean Tags are evicted from a cache they can be sent to other caches or dropped silently.

When Clean Tags are evicted with Dirty data, Clean Tags can be transferred downstream of the point of coherency 12 along with Dirty data A cache line with Dirty Tags is permitted, but not required, to treat the data as Dirty.

A cache line with Dirty data is permitted, but not required, to treat the Tags as Dirty if they are Valid.

The following section describes a specific example of the format of the tag, tag update and tag operation identifier fields 76, 82, 78, 68, 84 shown in FIG. 3 for different types of requests and responses. It will be appreciated that this is just one possible way of encoding this information. For example, the widths of the tag values, the size of the block of addresses which share the same tag, and the mapping of the tag operation identifier values could be changed.

The Tag field 76, 82 is included in the write data channel 54 and the read data channel 56. The tag field, Tag[(4*n)−1:0], provides n sets of 4-bit Tags, each Tag associated with an aligned 16 bytes of data. In other words, within the tag field 76, 82, Tag[((4*n)−1):4*(n−1)] corresponds to Data [((128*n)−1):128*(n−1)].

The Tag Update (TU) field 78 is included in the write data channel 54 and indicates which allocation tags should be updated based on the contents of the tag field 76 sent for a write request or a snoop response. The TU field 78 contains one TU bit for each of the tags provided in the tag field 76. Hence, TU[n−1] corresponds to Tag[(4*n)−1:4*(n−1)]. The TU field is only valid for snoop responses and write requests which update the allocation tags. For other transactions, the TU field 78 is set to 0.

The Tag operation identifier (Tag opcode, or TagOp) field 68, 84 is included on the request channel 52 and the read data channel 56 (in other examples the TagOp field for the read data channel 56 could be considered part of the completer response channel 58 instead). The TagOp field 68 on the request channel indicates the operation to be performed on the Tags present in the corresponding DAT channel. The TagOp field 84 on the read data channel 56 (or completer response channel 58) indicates properties of the tag supplied to the requester 4 on the tag field 82 of the read data channel 56.

The TagOp field 68 on the request channel may have one of the following encodings:

Invalid—The Tags are not valid.

Transfer—The Tags are Clean. Tag Match does not need to be performed. When TagOp is set to 'Transfer', all Tags in the Tag field should be transferred. Partial tag transfer is not supported. TU field is not applicable and is set to zero.

Update (for write requests only)—The Allocation Tag values have been updated and are Dirty. The Tags in memory should be updated. Only the Tags that have TU asserted should be updated.

Match (for write requests only)—The Address Tags in the tag field 76 of the write data channel 54 should be checked against the corresponding Allocation Tag values 40 obtained from memory for the cache line (multiple blocks) of data locations 42 corresponding to the target address. The Match Tag operation should be enabled for only those Tags that have the data enable (BE) 74 asserted. The TU field is not applicable and should be set to zero.

Fetch (for read requests only)—only Tags should be fetched from memory. All the Tags 40 for blocks of addresses in the cache line identified by the target address 66 should be fetched. Returned tags can be Clean or Dirty (as indicated by the TagOp 84 field of the read data channel 56). For these reads fetching of Valid data is not required. Any data received in the response is overwritten by the Requester.

One possible encoding of the TagOp 68 field on the request channel is as follows:

| TagOp[1:0] | Tag Operation |
| --- | --- |
| 0b00 | Invalid |
| 0b01 | Transfer |
| 0b10 | Update |
| 0b11 | Match/Fetch |

Note that Match and Fetch can share an encoding, because the request type 66 may indicate whether the request is a read request (for which TagOp 0b11 indicates Fetch) or a write request (for which TagOp 0b11 indicates Match).

For read responses, the TagOp field 84 on the read data channel 56 may have the same encoding as the TagOp 68 field on the request channel 52, except that there may be no need to support the Match/Fetch state. The TagOp field 84 on the read data channel 56 may indicate whether any returned tags on the tag field 82 of the read data channel 56 are Invalid (Invalid TagOp, 0b00), Clean (Transfer TagOp, 0b01) or Dirty (Update TagOp, 0b10). The coherency protocol may define rules on which states the tags can be returned in for a given type of request. The specific rules to be implemented may depend on the particular coherency protocol used.

Hence, this scheme provides an encoding by which the request may indicate the use to be made of the tag data channel 76, 82 (no specific tag actions, transfer of clean tags, transfer of dirty tags to be updated, fetching of allocation tags from memory, or transfer of an address tag to be used in a tag error checking operation), and a read response can indicate whether returned tags are clean, dirty or invalid. It is possible for the write data channel 54 and snoop request/response channel to be expanded to include a TagOp field 84 in a similar way, in some implementations, but this may not be needed for all implementations. For example, a TagOp field could be included on the write data channel, so that if there is a change in coherency state between the time that a write request is issued on the request channel 52 and the time that the write data is sent on the write data channel 54 (e.g. because a cache line has been made clean or invalid by a snoop request received during the intervening time period), then the TagOp field on the write data channel 54 could indicate the new state of the cache line (e.g. indicating that the write data can now be treated as having a TagOp of "Transfer" or "Invalid" instead of "Update").

FIGS. 5 to 12 illustrate a number of use cases for the tag related signal paths on the memory interface as discussed above.

FIG. 5 shows an example of handling a tag-error-checking type of write request, for which the tag operation identifier 68 on the request channel 52 specifies the "Match" value. In addition to the tag operation identifier 68, the write request also specifies a group identifier 70 equal to a given value X chosen by the requester (as well as other parameters of the request such as the request type and target address described above). The group identifier 70 identifies the group of transactions to which the write request belongs. In parallel with the request on the request channel 52, write data 72 is transferred on the write data channel 54, specifying the data to be written to the addressed location in memory identified by the target address 64. Also, the address tag 46 to be used in the tag error checking operation is transferred using the tag signal path 76 of the write data channel 54. In response to the write request, the completer performs a write operation to write the write data 72 (or data derived from the write data 72) to the addressed memory location, and also controls the tag checking circuitry 30 at the completer to perform a tag checking operation to check whether the address tag 46 provided on the tag signal path 76 of the write data channel 54 matches the allocation tag 40 stored in memory for a block of addresses including the target address 64. However, if the allocation tag 40 for the relevant block of addresses needs to be read from memory then this may be slow and may delay determining the outcome of the tag error checking operation. To prevent the tag checking response delaying signalling of the write response, the memory protocol used by the interface may support separate responses to the write and the tag checking operation respectively. Hence, the completer can provide a tag match response 100 and a write response 102 over the completer response channel 58, which are distinguished by different values of the response type value 86.

Hence, the memory interface protocol supports use of a separate TagMatch response which can be returned independently from any other responses that would be required for a write transaction. A typical use model for memory tagging is to detect poorly written software, which suffers from errors such as buffer overrun or use-after-free. It is possible to use memory tagging in a precise mode to detect the exact instruction that was at fault, however this approach can significantly degrade performance. An alternative approach, which may be more commonly used, is simply to detect which bodies of software generate error conditions in a running system. Once a body of software is known to generate errors (or a particularly high number of errors) it is possible to carry out a more detailed offline investigation in to that software, which can then be done in an environment where the precise mode is used. In a less precise fault tracking mode, it is only necessary to determine which body of software causes an error condition, so the response from the tag checking operation is not required to be returned precisely alongside other responses for the transaction. It is acceptable to delay the response and only detect whether or not errors have occurred at the point that a particular body of software completes execution.

Hence, the approach shown in FIG. 5 avoids delaying the transaction completion response, while waiting for a Tag check to be performed. In some cases this saving may only be a few cycles for the check, but in some cases where the Tag required for the check is not immediately available and must be fetched from memory then a significant saving is possible, possibly in the tens to hundreds of ns range.

However, this approach may require an additional message to be sent across the interconnect. The extra bandwidth incurred by this can be mitigated by also supporting a combined Write Completion and TagMatch response message which can be sent as a single response on the completer response channel 58, in cases where the tag check can be performed sufficiently quickly to combine the result with the write completion response 102. This avoids the additional message overhead when possible.

Additionally, to simplify the process of determining whether all the TagMatch results pertaining to a particular body of software have been received, a Group ID value 70 is used within the transaction request and the TagMatch result. A single body of software can use a single Group ID value. The completer generates the TagMatch response 100 specifying a response Group ID 88 with the same numeric value as was included for the Group ID 70 of the corresponding write request. When issuing transactions, the number of requests using the Group ID value can be counted by the requester, and then the number of TagMatch results (or combined Write Completion/TagMatch messages) received with the same Group ID value can be counted. As the results are returned it is possible to record if any failure results are observed using a single bit sticky flag or by counting the number of failure results. At the end of execution of the body of software, it can be determined that all TagMatch response have been received by checking that the number of responses received matches the number of requests sent. This approach requires much less complex hardware than an approach which attempts to detect which individual requests failed the tag error check, which would require a long list of all the outstanding transaction IDs and comparison circuitry to match the transaction IDs of TagMatch responses against the list.

Even if a scenario exists where it is desirable to determine exactly which transaction request caused a pass or fail response, it is always permitted to use a unique GroupID value for each request, thus giving a precise response indication.

Figure 6:
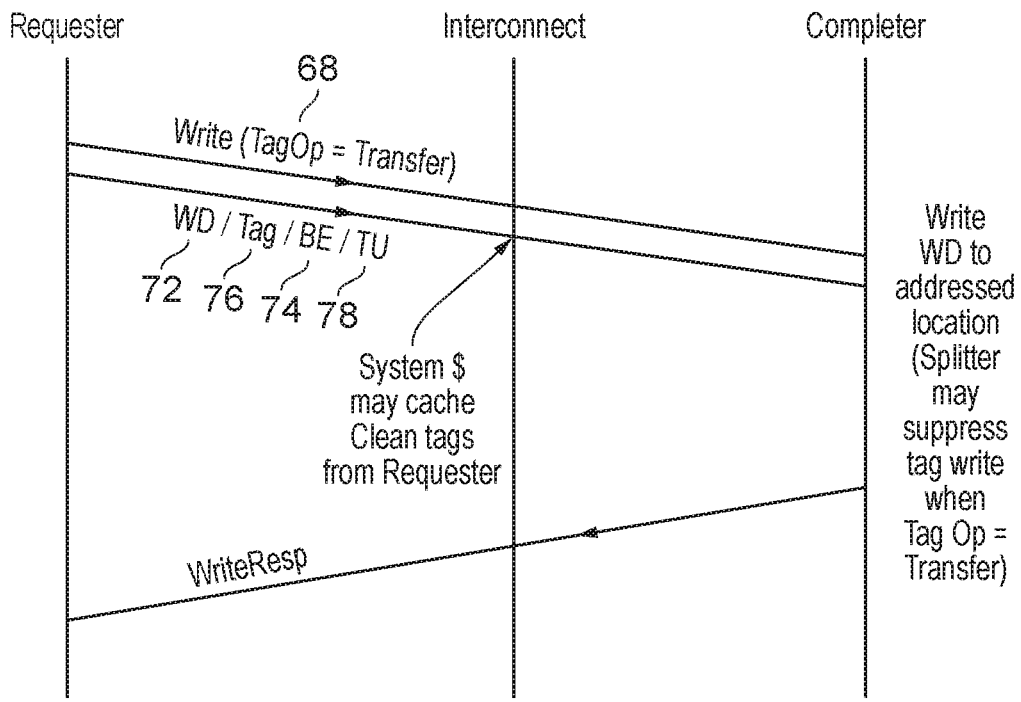
FIG. 6 illustrates an example of a requester passing clean tags to a completer.

FIG. 6 shows an example of a write request specifying the "Transfer" value for the tag operation identifier 68, which indicates that the requester 52 is passing clean copies of cached tag values to the completer for a particular cache line. The tag "transfer" form of write request can be used when the Requester has a clean copy of the Tag values for a particular cache line. Passing clean Tags downstream alongside a write transaction allows the Tag values to be held alongside the write data in any lower level cache. For example, FIG. 6 shows a case where passing the clean tags down towards the completer allows the interconnect 10 to cache the clean tags within the system cache 16. It may seem counter-intuitive to pass clean Tags, but the motivation for doing so is based on the principle that if one agent in a system has gone to the trouble of fetching Tags then there is a high probability that different agents in the system will also make use of the Tag values. It is always permitted to discard clean Tags, so no additional cost is imposed on other components in the system by passing the Tags speculatively. By allowing downstream caches to cache the tags, this can increase the chance that if another requester requires the same tags, they will be present in the system cache 16 or other intervening cache, allowing faster access than if the tags had to be fetched all the way from main memory.

When a tag transfer operation is provided as shown in FIG. 6, to transfer clean tags from a requester to a completer, if the completer has a tag splitter 29 as shown in the example of FIG. 1, then the tag splitter may detect from the "Transfer" indication of the tag operation identifier 68 that the tags do not need to be written to memory as they are clean. The tag splitter 29 can therefore suppress a tag write operation to the tag memory 26, saving power and memory bandwidth at the tag memory.

Figure 7:
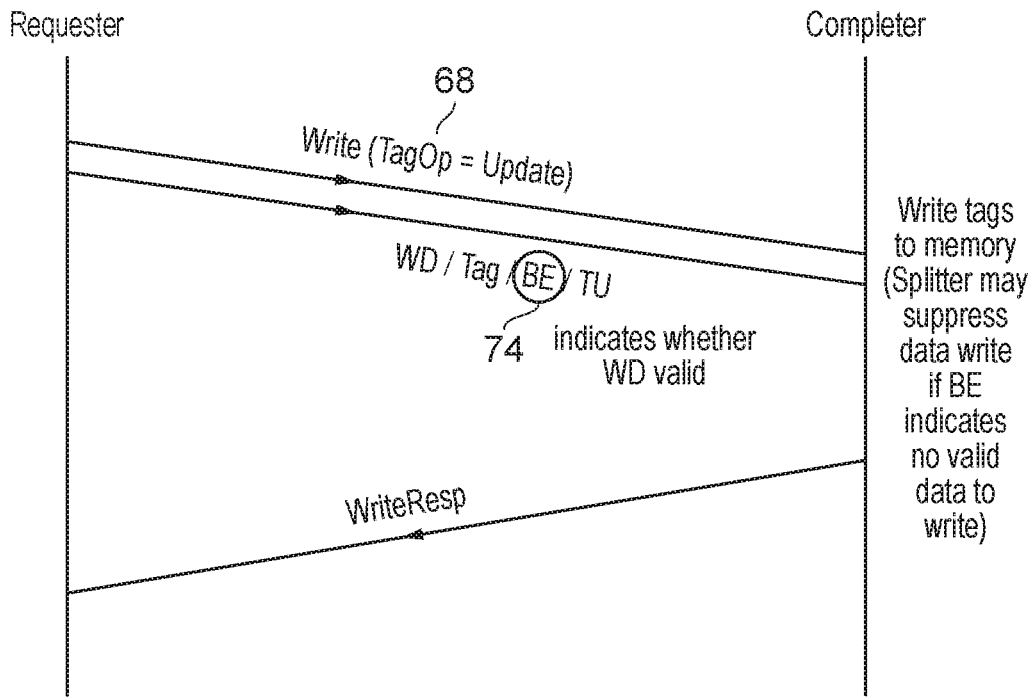
FIG. 7 shows an example where a write request to write tags to memory specifies whether data on the corresponding data signal path is valid.

Conversely, when the tag operation identifier 68 for a write request indicates "Update" as shown in FIG. 7, then this indicates that the tag values are dirty and should be written back. In this case, while the write to the tag memory 26 may be required at the completer end, it is possible that the byte enable value 74 for the write request may indicate that the data signal path 72 on the write data channel 54 does not contain any valid data. If the request does not specify any valid data, then the tag splitter 29 may suppress any data write operation to the data memory 24 in response to that write request, to conserve memory bandwidth and save power. Hence, by providing a separate indication 74 of whether the data on the data signal path 72 of the write data channel 64 is valid, separate from the indication in the tag operation identifier 68 of whether the tag values on the tag signal path 76 are clean or dirty, the tag splitter 29 can make independent decisions of whether it is necessary to issue a data write operation to the data memory 24 and whether it is necessary to issue a tag write operation to the tag memory 26 respectively, to avoid redundant write operations.

Figure 8:
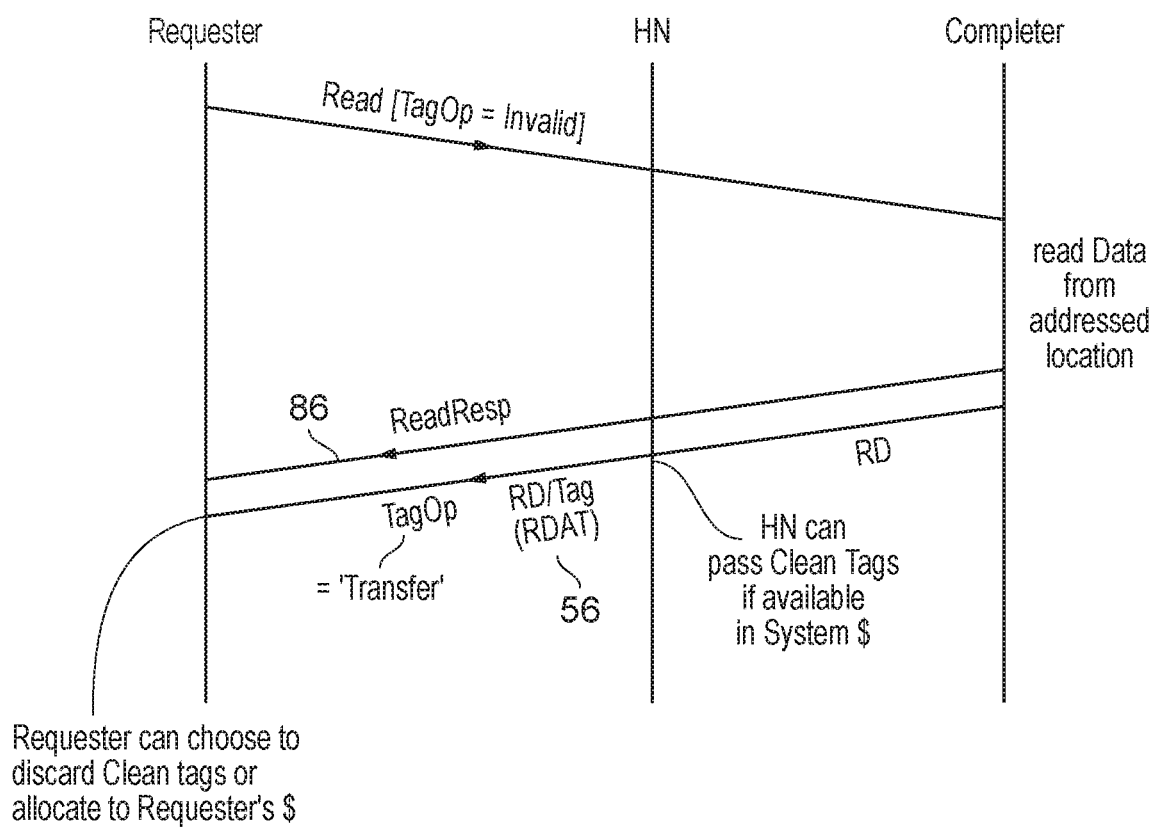
FIG. 8 schematically illustrates an example where a response to a read request may provide clean tag values to a requester even if the requester has not requested that the tags are passed.

FIG. 8 shows an example of a read request issued by the requester on the request channel 52 which specifies in the tag operation identifier 68 that the tag operation is "Invalid", which indicates that the requester 4 is requesting that data is read from the addressed location identified by the target address, but is not explicitly requesting that any tag value should be returned from memory. In this case the read request may cause the completer to read data associated with the addressed memory location and return the read data on the read channel 56. The read data 80 may be accompanied by a read response 86 provided on the completer response channel 58. However, as the tag signal path 82 of the read data channel 56 is otherwise unused, the completer may optionally choose to return clean tag values on the tag signal path 82 even when not requested by the requester. This can be useful because it may allow the clean tag values to be cached in a system cache 16 or in the cache 6 within the requester 4, which may allow improved performance if the tags are required later. When clean tags are returned in response to a read request marked as "Invalid" in the tag operation identifier 68, the tag operation identifier 84 for the read response is set to "Transfer" to distinguish from the case where no valid tags are returned (if no valid tags are returned, the read response's tag operation identifier 84 is set to "Invalid").

Hence, the memory interface protocol provides an encoding for returning clean tags for a read transaction when not requested. It is always permitted to discard clean Tags, so no additional cost is imposed on the Requester if it has no ability to store the Tags in its own cache. That is, when the read response's tag operation identifier 84 is "Transfer", the requester can decide whether to retain or discard the received tags. It may seem non-intuitive to return clean Tags when not requested, but the motivation for doing so is based on the principle that if one agent in a system has gone to the trouble of fetching Tags then there is a high probability that different agents in the system will also make use of the Tag values. It is never required to return clean tags for a read transaction when not requested, so no additional cost is incurred.

In particular, it can be useful to pass clean tags when not requested, when there is an intermediate node between the requester and the completer responsible for reading main memory, which has a cached copy of the tags associated with the target address in an associated cache (e.g. system cache 16), separate from the underlying copy of the tags in main memory. As shown in the example of FIG. 8, although the completer servicing the read request may not have obtained any tags, as the read request or read response passes through the home node 12, the home node 12 may detect that the clean tags for the target address are already available in the system cache 16, and so when passing on the read response, the home node could add the clean tags on the tag channel 82 to accompany the read data 80 already provided by the completer.

Figure 9:
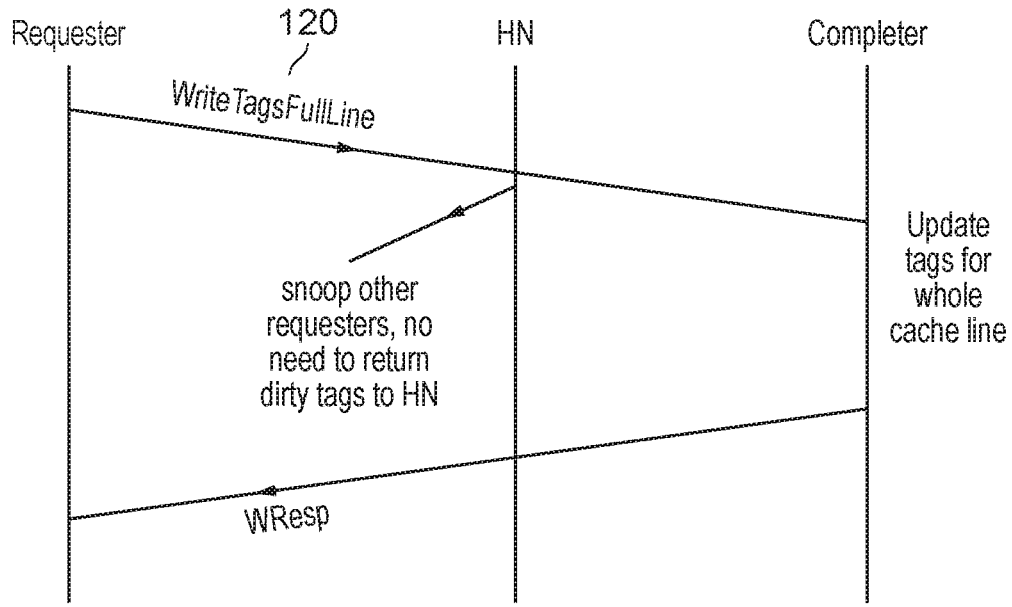
FIG. 9 shows an example of a write request specifying whether tags are to be updated for an entire cache line.

FIG. 9 shows an example illustrating a full line tag write request 120 which may be issued on the request channel 52 together with updated tag values on the tag signal path 76 of the write data channel 54. The request type identifier 66 may have a separate encoding for identifying that the write request 120 will update all the tag values associated with all the blocks of addresses within a given cache line. This may distinguish the request from other types of write request which only update part of the tags for a given cache line. The full line tag write request 120 can enable the home node 12 to detect that, when it snoops other requesters, those requesters do not need to return any dirty tags to the home node but can simply discard them upon invalidating them from their own cache 6. A similar full data write request may be provided which indicates that an entire cache line of data will be updated. In some cases, the memory interface protocol may support three different variants of full line requests:

full line write of both data and tag: all the data and all the tags associated with the entire cache line are to be updated;

full line write of data, partial line write of tag: all the data associated with the entire cache line is to be updated, but only some of the tags for that cache line are to be updated;

partial line write of data, full line write of tag: all the tags for the cache line are to be updated, but only part of the data is to be updated for that cache line.

Hence, providing protocol support for giving an upfront indication that an entire line of data or tags is to be updated can be useful for providing a guarantee removing the need for the requester to obtain the current copy of the data and/or tags for that tag line and signalling that it is legal to invalidate any dirty copies of the data or tags for that line without returning the dirty values.

Figure 10:
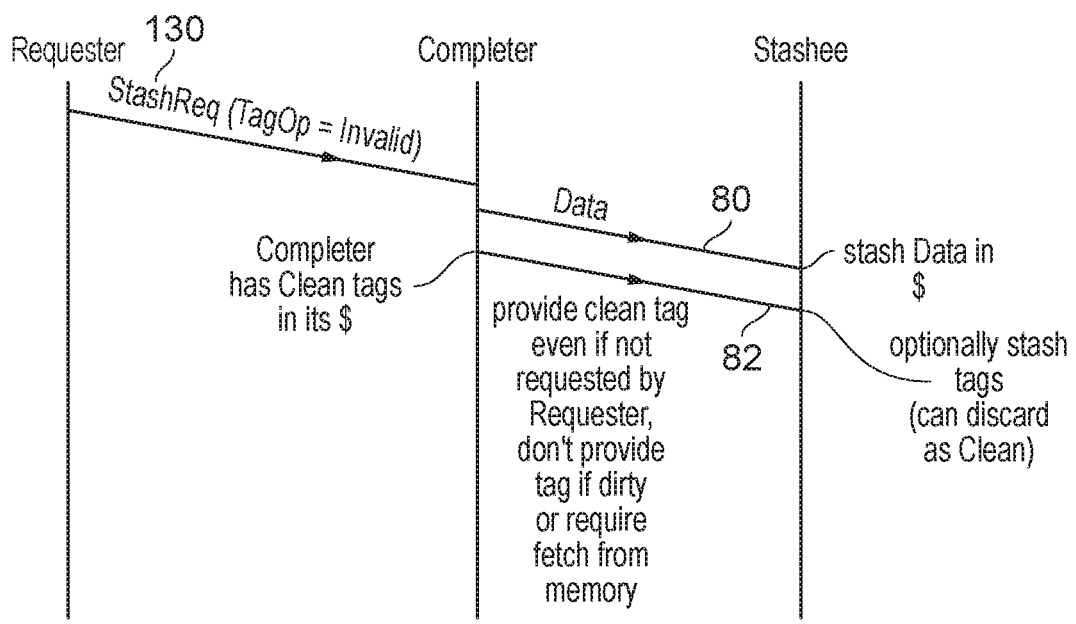
FIG. 10 shows an example of a stashing request specifying whether tags are to be stashed in a stashing target cache, and a completer providing clean tags for stashing in the stashing target cache even if not requested by the requester.
Figure 11:
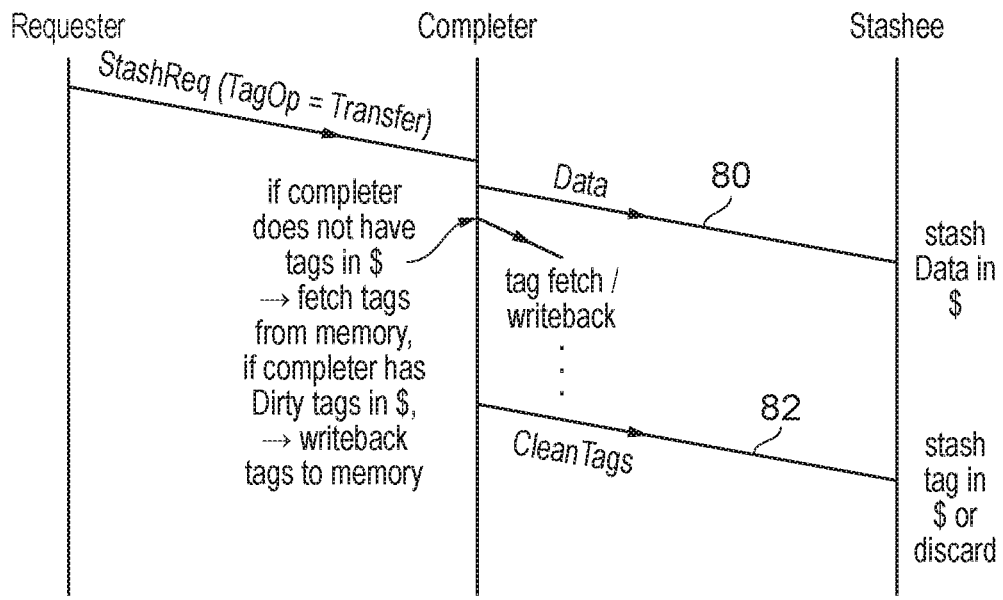
FIG. 11 shows another example of a stashing request which does request that tags are transferred to the stashing target cache.

Another type of request that can be issued on the request channel 52 is a stashing request 130 as shown in FIGS. 10 and 11. Stashing transactions can be used by a Requester to pre-load a particular cache line into a cache associated with a "Stashee" (another entity in the system, other than the requester), with the motivation that it ensures a very low access latency when the Stashee comes to use the cache line. A typical use of stashing transactions is that a co-ordinating component, such as a work scheduler, sends a stashing transaction which includes the address of the cache line to be stashed and the node ID of the component that contains the cache where the line should be placed. This component where the line is to be placed is referred to as the Stashee. The interconnect sends a snoop transaction to the Stashee and the Stashee then provides a snoop response which indicates whether or not it wants to be sent the data for the cache line, in other words whether it is accepting or rejecting the stashing operation. However, with this approach, there may be no indication on the Stash snoop whether or not the Stashee should request Tags when accepting a stashing transaction. Also, it is expected that a stashing transaction is used only when the Stashee does not have a copy of the cache line, so the Stashee does not have an indication whether or not it previously used Tags for that cache line.

To address this, the original Stash request from the Requester may indicate whether or not Tags should be stashed alongside the cache line, rather than allowing the Stashee to decide. Hence, the Requester may specify, in the tag operation identifier 68 for a stashing requester, either the "Invalid" value indicating that stashing of tags is not requested, or the "Transfer" value indicating that stashing of tags is requested.

Handling of the stashing request at the interconnect 10 can be performed as follows:

If, in the response to the Stashee's snoop response, Tags are returned to the Stashee along with the associated Data, then the returned tags should be clean. This means that if the Stashee cannot accept the Tags then they can be safely dropped.

If clean Tags are available at no cost, for example from a system cache, then they may be returned, even if the Requester sending the original snoop request had specified "Invalid" and so had not explicitly requested that the Tags should be stashed. This is based on the assumption that if any other agent has made use of tags for this cache line previously then there is an increased likelihood that the Stashee will also need tags.

Also, if the original Stash request had a TagOp of "Transfer" then this indicates that there is a very high likelihood that Tags will be required by the Stashee. It is therefore worthwhile performing a Tag fetch from memory so that Tags can be returned alongside the data. This means that when the Stashee comes to use the data that has been placed in its cache then Tags will also be available and there will be no additional latency required to perform the Tag fetch when needed.

Hence, FIG. 10 shows an example where the stashing request 130 specifies a tag operation identifier 68 of "Invalid" indicating that it does not request that the allocation tags for the requested cache line identified by the target address 64 should be stashed in the stashing target cache associated with the Stashee. However, in the example of FIG. 10, the completer (e.g. the home node 12) determines that it has clean tags for the requested cache line in its cache 16, and so despite the stashing requester not requesting transfer of the tags, the completer provides the clean tag values anyway along with the requested stashing data. The tags are passed over the tag signal path 82 of the read data channel 56, along with the corresponding data 80, and the stashee can then optionally stash the data and the tags provided in its own cache 6. As the tags provided are clean, then it is no problem if the stashee cannot accept the tags as it can simply discard them. In the example of FIG. 10, if the completer did not already have clean tags available in its cache, then it may not incur the cost of fetching tags from main memory, as the stashing request did not specify that the tags were required and so the probability of those tags actually being useful may be relatively low.

On the other hand, as shown in FIG. 11, if the requester 4 sending a stashing request species a tag operation identifier 68 of "Transfer" this indicates that the requester does wish the allocation tags for the requested cache line to be transferred to the stashing target cache. In this case, even if the completer does not already have the tags in its cache, it may request that the tags are fetched from memory (in contrast to FIG. 10), and then pass the tags 82 to the stashee along with the corresponding data 80. On the other hand, in FIG. 11 if the completer has dirty tags in its cache, then it may trigger a write back of those tags to memory, so that the tags can be provided to the stashee in a Clean state, to allow the stashee to discard the tags if necessary.

In the example of FIG. 7 above, the write request may specify a tag "Update", which permits the associated write data 72 to be invalid. In the example of FIG. 7, tag values are passed over the tag signal path 76 of the write data channel 54.

However, the tag signal path 76 (and the corresponding tag signal path 82 on the read data channel 56) may have a fixed width which may not be particular wide, as for most regular memory read/write operations it may only be desired to transfer the tags corresponding to a single cache line. For example, the tag signal paths 76, 82 could use a fixed field for tag transfer specifying 4-bit tag values for each 16-bytes of data. Hence, depending on the data bus width, the tag signal path 76 could have the following widths:

| Data bus width | Tag bits transferred |
| --- | --- |
| 128 | 4 |
| 256 | 8 |
| 512 | 16 |

Of course, these are just some possible examples—it is not essential for tags to be 4 bits wide for example. However, this example serves to indicate that typically the data bus width may be much greater than the tag bus width.

Figure 12:
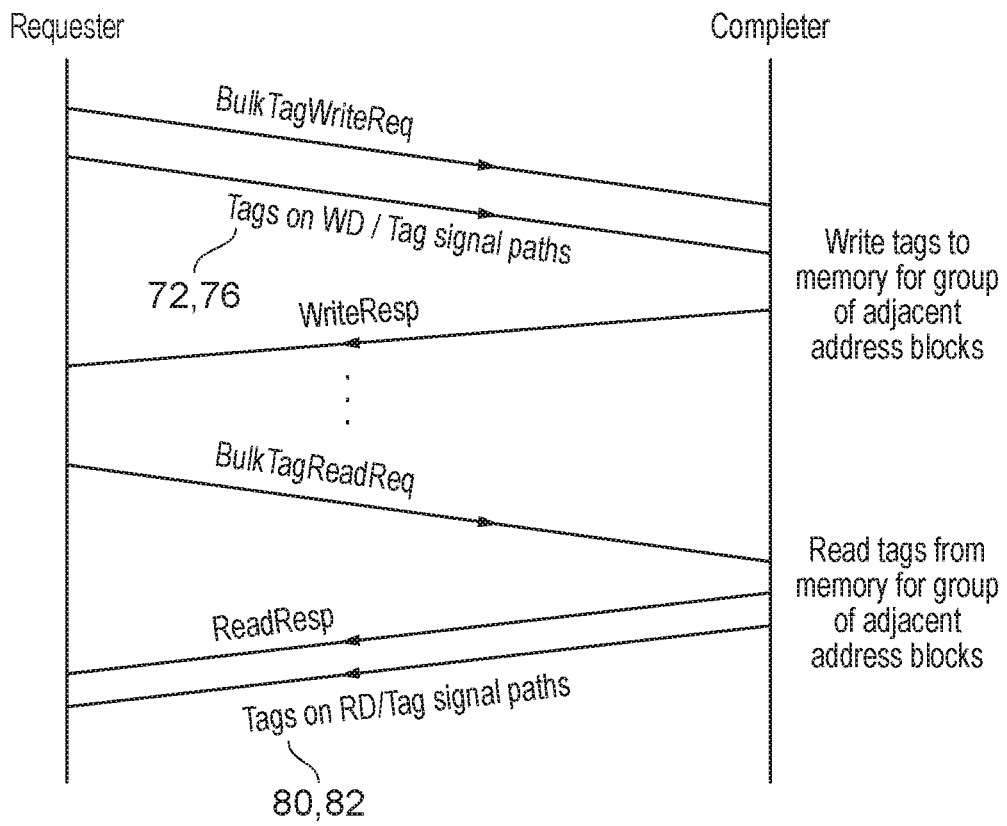
FIG. 12 illustrates examples of bulk tag transfer requests for which tag values are transferred using the data signal path.

In situations where only tags need to be read or only tags need to be written, it is possible to significantly reduce the number of transactions required by reusing the data bus field and sending adjacent tags values in this field. This results in a significance reduction (e.g. up to a 32× reduction in the examples above) in the number of data transfers that are required. Hence, bulk tag write and read requests may be defined as shown in FIG. 12. The bulk tag read and write requests use the data signal paths 72, 80 on the write data channel 54 and the read data channel 56 to transfer tag values.

As shown in the top part of FIG. 12, for a bulk tag write request issued on the request channel 52, the request type identifier 66 and/or the tag operation identifier 68 identifies that the data signal path 72 on the write data channel 54 provides tags (tags could also be provided over the tag signal path 76 if desired), and in this case the completer responds to the request by writing the tags obtained on the write data channel 54 to memory. The obtained tags relate to blocks of addresses which are adjacent to each other in the address space, with the target address 64 of the request identifying the address of the first block in the group of adjacent address blocks.

Similarly, for a bulk tag read request as shown at the bottom part of FIG. 12, the request triggers the completer to read the tags from memory which correspond to a group of adjacent address blocks starting at the block identified by the target address 64 specified in the read request. The read tags are provided to the requester via the read data signal path 80 of the read data channel 56 (and optionally also over the tag data path 82 of the read data channel 56). Hence, with the bulk request shown in FIG. 12 a much greater number of tags per request can be transferred from the requester to the completer or from the completer to the requester then if only the tag signal path was used. This can greatly reduce the number of data transfer requests required to update or read a certain number of allocation tags.

Figure 13:
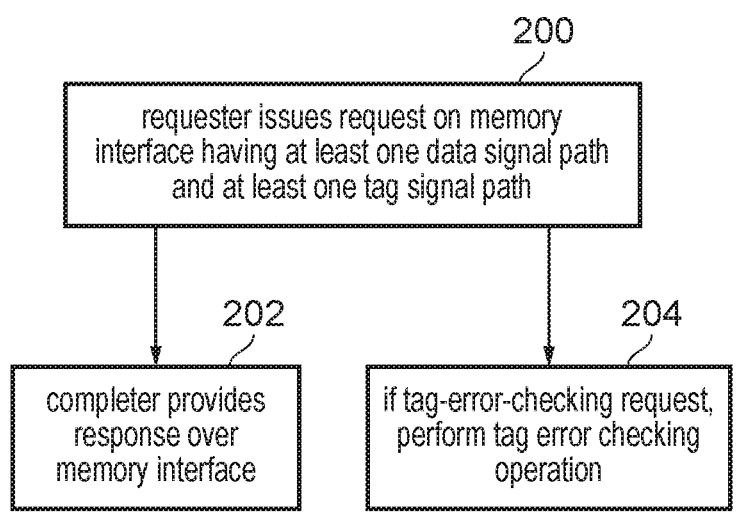
FIG. 13 is a flow diagram showing a method of handling requests over a memory interface.

FIG. 13 shows a flow diagram showing a method of handling requests in the memory system. At step 200 the requester 4 issues a request on the request channel 52 of the memory interface 50. The memory interface has at least one data signal path 72, 80 for exchanging data with the completer and, in parallel with the at least one data signal path 72, 80, at least one tag signal path 76, 82 for exchanging allocation tag values or address tag values with the completer. At step 202, in response to the request the completer provides a response over the completer response channel 28 of the memory interface. The response may be accompanied by read data or tags on the read data channel 56.

Also, in response to the request, if the request is a tag-error-checking request then at step 204 tag checking circuitry 30 in either the requester or the completer performs a tag error checking operation to compare an address tag 46 associated with the target address 64 of the request with the allocation tag 40 stored in memory for a block of addresses containing the target address. For read requests the tag error checking operation may be performed at the requester after receiving the response from the completer, where the response from the completer may provide the allocation tag 40 read from the memory system to be compared with the address tag 46 specified by the requester. For write requests, the tag error checking operation may be performed at the completer, based on the allocation tag 40 read from memory and an address tag which is passed over the tag signal path 76 of the write data channel 54 by the requester 4. If the tag error checking operation detects a mismatch between the address tag 46 and the allocation tag 40, an error reporting action or error handling response action can be taken, such as incrementing an error count, logging the error in an error log, marking a flag indicating that the currently executing software or portion of software has encountered at least one error, or generating an interrupt or exception, depending on the needs for a given system.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

The invention claimed is:

1. An apparatus comprising:
a requester to issue a request specifying a target address indicating an addressed location in a memory system;
a completer to respond to the request issued by the requester; and
tag error checking circuitry to perform a tag error checking operation when the request issued by the requester is a tag-error-checking request specifying an address tag, the tag error checking operation comprising determining whether the address tag matches an allocation tag stored in the memory system associated with a block of one or more addresses comprising the target address specified by the tag-error-checking request; in which:
the requester and the completer are configured to communicate via a memory interface having at least:
at least one data signal path to exchange read data or write data between the requester and the completer; and
at least one tag signal path, provided in parallel with the at least one data signal path, to exchange address tags or allocation tags between the requester and the completer.

2. The apparatus according to claim 1, in which the request is associated with a tag operation identifier indicative of how the at least one tag signal path is to be used for the request.

3. The apparatus according to claim 2, in which, for a read request issued by the requester to request that read data associated with the target address is transferred to the requester over the at least one data signal path, the tag operation identifier specifies whether the requester also requests that at least one corresponding allocation tag should be returned on the at least one tag signal path, the at least one corresponding allocation tag comprising one or more allocation tags associated with one or more blocks of addresses including at least the block of addresses comprising the target address.

4. The apparatus according to claim 3, in which when a clean value of the at least one corresponding allocation tag is available to the completer, the completer is configured to return the at least one corresponding allocation tag even when the tag operation identifier specifies that the requester has not requested that the at least one corresponding allocation tag is returned.

5. The apparatus according to claim 2, in which for a write request issued by the requester to request that a write to the addressed location is performed based on write data transferred on the at least one data signal path, the tag operation identifier specifies whether the requester has also provided at least one corresponding allocation tag on the at least one tag signal path, the at least one corresponding allocation tag comprising one or more allocation tags associated with one or more blocks of addresses including the block of addresses comprising the target address.

6. The apparatus according to claim 5, in which the tag operation identifier has an encoding identifying whether the at least one corresponding allocation tag provided on the at least one tag signal path for the write request is clean or dirty.

7. The apparatus according to claim 6, in which the write request also specifies whether the write data for the write request is valid, using a separate identifier from the tag operation identifier indicating whether the at least one corresponding allocation tag is clean or dirty.

8. The apparatus according to claim 5, in which, for a write request which specifies that the at least one corresponding allocation tag is dirty and should be written to the memory system, the write request specifies an indication of whether all allocation tags associated with a plurality of blocks of addresses corresponding to the same cache line are to be updated in response to the write request.

9. The apparatus according to claim 2, in which when the tag operation identifier associated with the request specifies that the request is said tag error checking request, the completer is responsive to the request to control the tag error checking circuitry to perform the tag error checking operation using, as the address tag for the tag error checking operation, a tag value transferred from the requester over the at least one tag signal path.

10. The apparatus according to claim 9, in which when a write request is specified as the tag error checking request, the completer is configured to provide to the requester:
   a write response to the write request; and
   separate from the write response, a tag match response indicative of whether the tag error checking operation identified a match between the address tag and the allocation tag.

11. The apparatus according to claim 10, in which the tag-error-checking request specifies a group identifier identifying a group of requests to which the tag-error-checking request belongs, and
   the completer is configured to specify, in the tag match response, a group identifier matching the group identifier included in the tag-error-checking request that triggered that tag match response.

12. The apparatus according to claim 2, in which, for a stashing request requesting that data associated with the target address is to be allocated to a stashing target cache other than a cache associated with the requester, the tag operation identifier specifies whether at least one corresponding allocation tag should also be provided by the completer to the stashing target cache, the at least one corresponding allocation tag comprising one or more allocation tags associated with one or more blocks of addresses including at least the block of addresses comprising the target address.

13. The apparatus according to claim 12, in which when a version of the at least one corresponding allocation tag available to the completer is dirty, the completer is configured to suppress transfer of the at least one corresponding allocation tag to the stashing target cache in a dirty state, even when the tag operation identifier specifies that the stashing target allocation tag should be transferred to the stashing target cache.

14. The apparatus according to claim 12, in which when the tag operation identifier specifies that the at least one corresponding allocation tag should not be transferred to the stashing target cache, and a clean version of the at least one corresponding allocation tag is available in a cache associated with the completer, the completer is configured to transfer the at least one corresponding allocation tag to the stashing target cache despite the tag operation identifier specifying that the at least one corresponding allocation tag should not be transferred.

15. The apparatus according to claim 1, in which when the request is a bulk tag transfer request, the requester and the completer are configured to exchange, over the at least one data signal path, a plurality of allocation tag values associated with a plurality of adjacent blocks of addresses including a block of addresses comprising the target address.

16. The apparatus according to claim 1, comprising a home node to control coherency for a cached data value and a cached allocation tag stored in a cache of the requester based on a combined coherency protocol defining a common set of coherency state transitions for the cached data value and the cached allocation tag for a given address.

17. The apparatus according to claim 16, in which the combined coherency protocol defines a unique/shared coherency status for the cached data value and the cached allocation tag;
   when the unique/shared coherency status is unique, the requester is allowed to locally update, in the cache of the requester, the cached data value or the cached allocation tag for the given address without checking with the home node;
   when the unique/shared coherency status is shared, the requester is required to check with the home node before locally updating, in the cache of the requester, the cached data value or the cached allocation tag for the given address; and
   the combined coherency protocol constrains the cached data value and the cached allocation tag for the given address to have the same unique/shared coherency status.

18. The apparatus according to claim 16, in which the combined coherency protocol permits the cached data value to have a different clean/dirty coherency status to the cached allocation tag.

19. An apparatus comprising:
   means for issuing a request specifying a target address indicating an addressed location in a memory system;
   means for responding to the request issued by the means for issuing; and
   means for performing a tag error checking operation when the request issued by the means for issuing is a tag-error-checking request specifying an address tag, the tag error checking operation comprising determining whether the address tag matches an allocation tag stored in the memory system associated with a block of one or more addresses comprising the target address specified by the tag-error-checking request; in which:
   the means for issuing and the means for responding are configured to communicate via a memory interface having at least:
      at least one data signal path to exchange read data or write data between the means for issuing and the means for responding; and
      at least one tag signal path, provided in parallel with the at least one data signal path, to exchange address tags or allocation tags between the means for issuing and the means for responding.

20. A method comprising:
   issuing, by a requester, a request specifying a target address indicating an addressed location in a memory system;
   responding, by a completer, to the request issued by the requester, wherein the requester and the completer communicate via a memory interface, and the requester and completer exchange read data or write data via at least one data signal path of the memory interface; and
   when the request issued by the requester is a tag-error-checking request specifying an address tag:
      performing a tag error checking operation comprising determining whether the address tag matches an allocation tag stored in the memory system associated with a block of one or more addresses comprising the target address specified by the tag-error-checking request; and
      exchanging address tags or allocation tags between the requester and the completer via at least one tag signal path; provided in parallel with the at least one data signal path.

* * * * *